(12) United States Patent
Murata et al.

(10) Patent No.: US 6,525,635 B2
(45) Date of Patent: Feb. 25, 2003

(54) MULTILAYER INDUCTOR

(75) Inventors: Satoru Murata, Yokaichi (JP);
Hideyuki Mihara, Shiga-ken (JP);
Etsuji Yamamoto, Yokaichi (JP);
Yoshihiro Nishinaga, Hikone (JP);
Minoru Tamada, Yokaichi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/804,548

(22) Filed: Mar. 12, 2001

(65) Prior Publication Data

US 2001/0022547 A1 Sep. 20, 2001

(30) Foreign Application Priority Data

Mar. 10, 2000 (JP) .......................................... 2000-066219
Oct. 25, 2000 (JP) ........................................ 2000-326057

(51) Int. Cl.⁷ ............................................. H01F 27/02
(52) U.S. Cl. .......................... 336/83; 336/192; 336/200
(58) Field of Search ............................ 336/65, 83, 183, 336/192, 200, 206, 232; 29/602.1

(56) References Cited

U.S. PATENT DOCUMENTS 6,073,339 A * 6/2000 Levin .......................... 336/606
6,087,920 A * 7/2000 Abramov ..................... 336/192
6,087,921 A * 7/2000 Morrison ..................... 336/200
6,157,283 A * 12/2000 Tsunemi ....................... 336/192

FOREIGN PATENT DOCUMENTS

JP  2-256214  * 10/1990
JP  5-41324     2/1993

* cited by examiner

*Primary Examiner*—Elvin Enad
*Assistant Examiner*—Tuyen T. Nguyen
(74) *Attorney, Agent, or Firm*—Keating & Bennett, LLP

(57) ABSTRACT

A small-sized multilayer inductor having a greatly increased inductance value includes two thin-film coils with an insulation layer interposed therebetween, the coils being disposed on a coil-winding portion of a wound-core member. At positions opposing flanges of the wound-core member, two terminal electrodes for a first thin-film coil are respectively provided. To one of the two terminal electrodes, the starting end of the first thin-film coil is electrically connected via one connection opening while the finishing end of the first thin-film coil is electrically connected to the other terminal electrode via the other connection opening. Similarly, at positions opposing the flanges of the wound-core member, two terminal electrodes, which are electrically connected to a second thin-film coil, are respectively provided.

19 Claims, 26 Drawing Sheets

MULTILAYER INDUCTOR

BACKGROUND OF THE INVENTION

1. Field of the Invention

The present invention relates to multilayer inductors, and in particular, the present invention relates to a surface-mount type multilayer inductor used in choke coils, LC filters, transformers, and balun (balanced-to-unbalanced) transformers.

2. Description of the Related Art

A conventional coil element is disclosed in Japanese Unexamined Patent Application Publication No. 5-41324. The coil element is provided with a column-shaped magnetic core including a magnetic body such as a ferrite having an insulation resistance. On the surface of the magnetic core, a conductive film is provided, and the conductive film is irradiated with a laser beam and moved in the axial direction while being rotated, such that a spiral groove defining a coil is formed, and a coil spirally wrapped around the magnetic core is formed from remnants of the conductive film. The above publication also discloses that two or more coils may be provided by cutting the conductive film.

In conventional coil elements, there are several ways to obtain a large value of inductance including: using a magnetic core having a large cross-section, increasing the number of turns of the coil, and forming the magnetic core from a material having a large value of permeability $\mu$. However, the magnetic core is naturally limited in permeability $\mu$ and in size (cross-sectional area, length), so that a desired inductance value has been difficult to obtain. It is virtually impossible to achieve a desired inductance value especially when forming plurality of coils on one magnetic core.

SUMMARY OF THE INVENTION

To overcome the above-described problems with the prior art, preferred embodiments of the present invention provide a small-sized multilayer inductor having a large inductance value.

A multilayer inductor according to a preferred embodiment of the present invention includes a core member, a plurality of thin-film coils provided on the surface of the core member with an insulation layer interposed therebetween, the thin-film coils being wound around the outer periphery of the core member, and terminal electrodes arranged at ends of the core member and electrically connected to each end of the thin-film coils, wherein each of the terminal electrodes is defined by providing a dividing groove on the core member from an end surface thereof to the outer periphery thereof such that the terminal electrode is electrically insulated from the other terminal electrode. Each of the thin-film coils is preferably providing by forming a spiral coil-forming groove on a thin-film conductor provided on the outer periphery of the core member.

The core member may be drum-shaped, for example, including a distinguishing portion provided on at least one of the end surfaces of the core member and a side thereof for distinguishing the orientation of the core member. Furthermore, preferably, the starting and finishing ends of at least one of the thin-film coils are electrically connected to the respective terminal electrodes via connection openings provided in the insulating layer.

With the structure described above, the length of the core member is greatly reduced and the number of turns of the thin-film coils is greatly increased in comparison with an inductor in which two thin-film coils are arranged in a row in the axial direction of a core member. Also, a plurality of thin-film coils are coaxially arranged on the core member with the insulation layer interposed therebetween, such that the distributed capacity between the thin-film coils is substantially uniform. Furthermore, the starting end and the finishing end of each coil-forming groove are shifted with each other by substantially 180° in the winding direction of the core member, and the starting ends of two adjacent thin-film coils having the insulation layer interposed therebetween are shifted with respect to each other by substantially 180° in the winding direction of the core member, such that each terminal electrode has substantially the same shape and substantially the same area as each other.

The thin-film coil winds spirally around the outer periphery of the core member at a predetermined pitch. Therefore, the length of the dividing groove between a point intersecting with a spiral coil-forming groove and an end surface of the core member is greater than the lengths of the dividing groove between the starting end of the spiral coil-forming groove and each end surface of the core member and between the finishing end of the spiral coil-forming groove and each end surface of the core member, such that the terminal electrodes are securely and electrically insulated from each other.

When a dividing groove winding around from the end surface of the core member toward the outer peripheral surface thereof is provided, similar advantages can be achieved. In this case, the starting and finishing ends of the spiral coil-forming groove for each thin-film coil are respectively positioned on a single plane of the core member, so that each terminal electrode may have substantially the same shape and substantially the same area as each other.

Other features, elements, advantages and characteristics of the present invention will become more apparent from the detailed description of preferred embodiments thereof with reference to the attached drawings.

DETAILED DESCRIPTION OF PREFERRED EMBODIMENTS

Referring to the attached drawings, preferred embodiments of a multilayer inductor according to the present invention will be described below in company with its manufacturing method.

Figure 1:
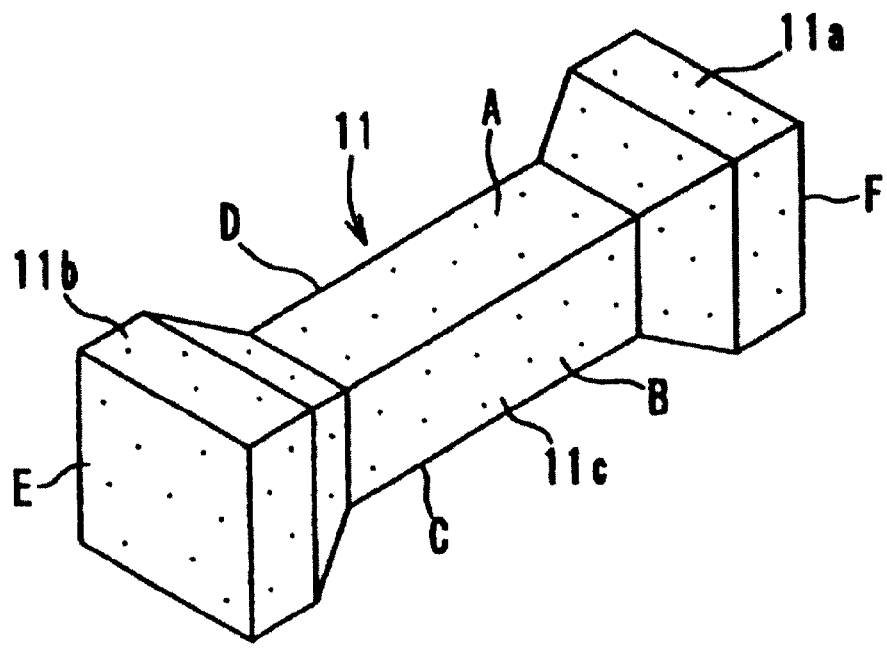
FIG. 1 is a perspective view of a multilayer inductor according to a first preferred embodiment of the present invention showing a manufacturing process.
Figure 2:
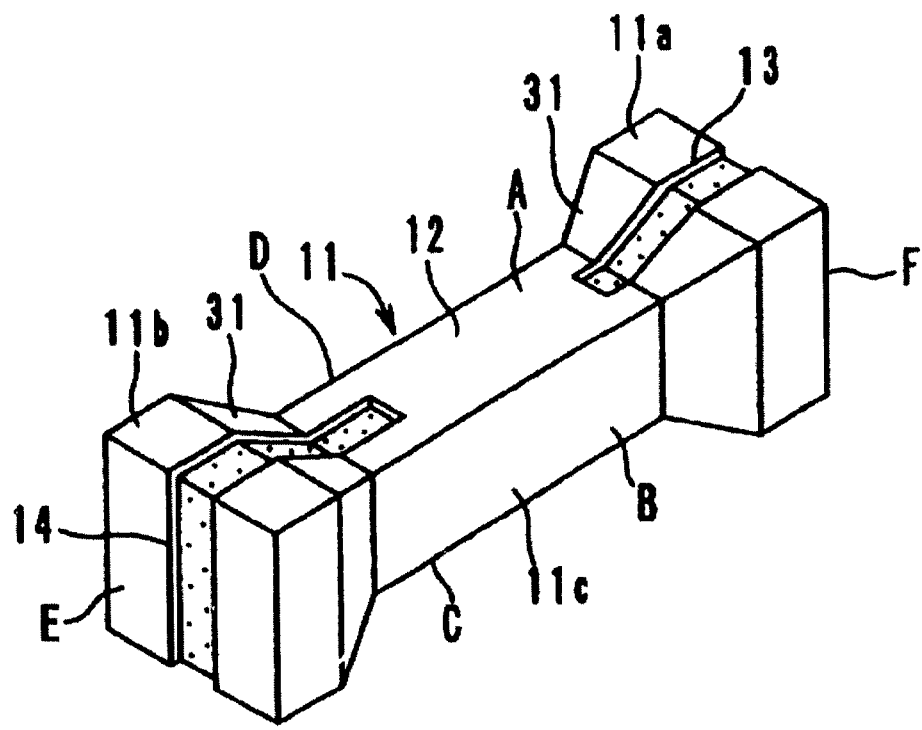
FIG. 2 is a perspective view of the multilayer inductor showing the manufacturing process continued from that shown in FIG. 1.

A first preferred embodiment is shown in FIG. 1, a drum-shaped wound-core member 11 is defined by a coil-winding portion 11c having a substantially square cross-section and flanges 11a and 11b provided at both ends of the coil-winding portion 11c. In the drawing, symbols A, B, C, and D denote four uneven sides of the wound-core member 11 and symbols E and F denote two end surfaces thereof. The wound-core member 11 is preferably made from a magnetic material such as ferrite, a non-magnetic ceramic material such as alumina, and a resin material, or other suitable material. After providing an insulation film coated on the surface of the wound-core member 11, as shown in FIG. 2, on the entire surface of the wound-core member 11, a thin-film conductor 12 is formed preferably via plating, sputtering, and or other suitable method. The thin-film conductor 12 is preferably made from Cu, Ni, Ag, Ag-Pd, or other suitable material.

Then, the wound core member 11 is inserted into a chuck of a spindle (not shown) of a laser processor. While rotating the spindle and moving the wound-core member 11 in a predetermined direction, the wound-core member 11 is irradiated with a laser beam in sequence of the route indicated by arrows K1 and K2 in FIG. 3. The irradiated portion of the thin-film conductor 12 is thereby removed to form dividing grooves 13 and 14.

Figure 3:
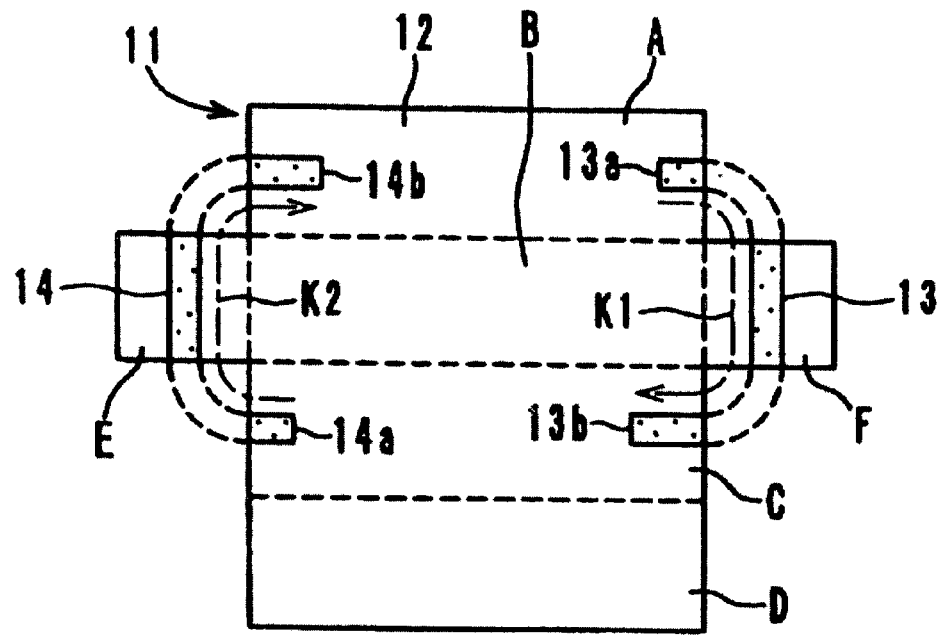
FIG. 3 is a schematic development of the multilayer inductor shown in FIG. 2.

As shown in FIGS. 2 and 3, from one end side of the coil-winding portion 11c on the side A of the wound-core member 11, the dividing groove 13 extends through a slope 31 and the flange 11a to extend to one end surface F of the wound-core member 11, and furthermore, it winds around the end surface F to extend to one end side of the coil-winding portion 11c via the flange 11a on the side C of the wound-core member 11 and the slope 31 thereon. Similarly, from the other end side of the coil-winding portion 11c on the side C of the wound-core member 11, the dividing groove 14 extends through the slope 31 and the flange 11b to extend to the other end surface E of the wound-core member 11, and furthermore, it passes around the end surface E to extend to the other end side of the coil-winding portion 11c via the flange 11b on the side A and the slope 31. In addition, FIG. 3 is a schematic development of FIG. 2, and the unevenness of the flanges 11a and 11b is not shown therein so that the flanges are depicted to be on a single plane of the coil-winding portion 11c.

Figure 4:
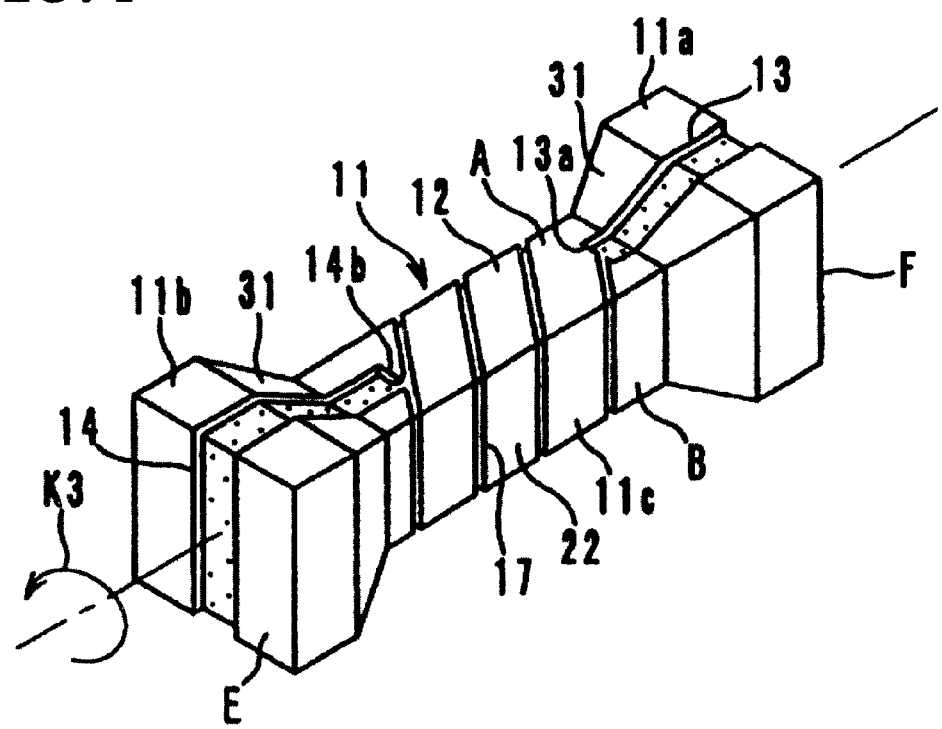
FIG. 4 is a perspective view of the multilayer inductor showing the manufacturing process continued from that shown in FIG. 2.

Then, as shown in FIG. 4, the wound-core member 11 is irradiated with a laser beam and scanned in the longitudinal direction of the wound-core member 11 while being rotated in the direction of arrow K3. The portion of the thin-film conductor 12 irradiated with a laser beam is thereby removed to form a spiral groove 17 for defining a coil. Thus formed is a first thin-film coil 22 spirally winding around the outer peripheral surface of the coil-winding portion 11c.

Figure 5:
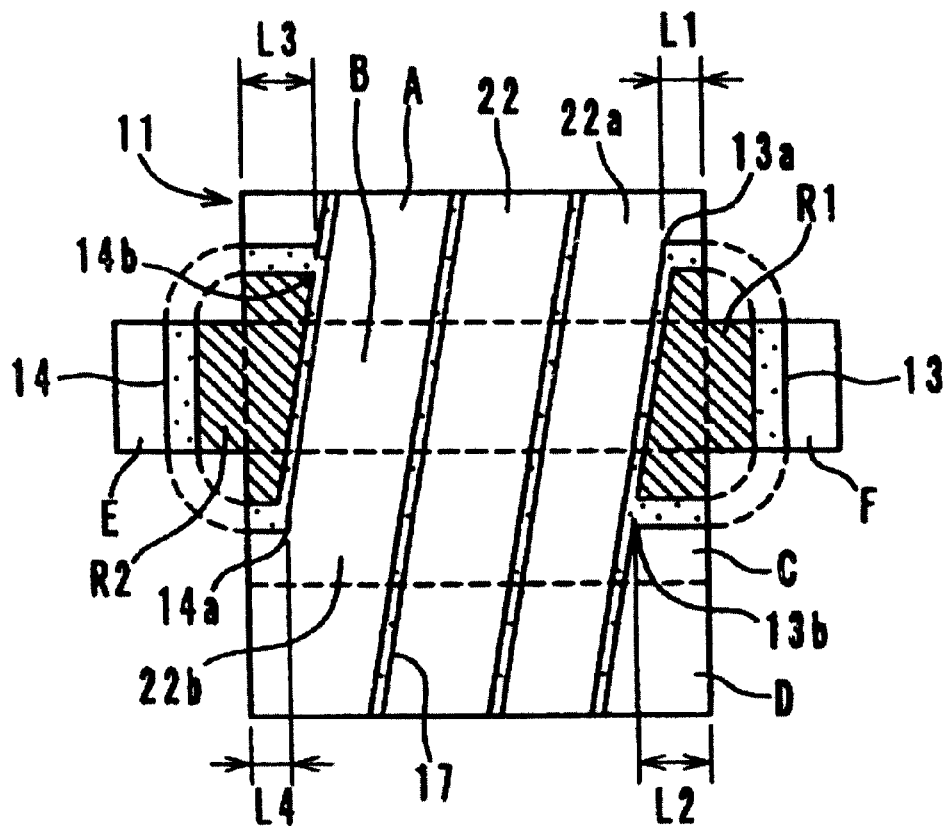
FIG. 5 is a schematic development of the multilayer inductor shown in FIG. 4.

As shown in FIG. 5, from one end 13a of the dividing groove 13 as a starting end located on the side A of the wound-core member 11, the coil-forming groove 17 extends through the other end 13b of the dividing groove 13 and one end 14b of the dividing groove 14 to extend to the other end 14a of the dividing groove 14 as a finishing end located on the side C of the wound-core member 11. Accordingly, the starting and finishing ends 13a and 14a of the coil-forming groove 17 are shifted from each other by approximately 180° about the axis of the wound-core member 11. In addition, the positions of the starting and finishing ends 13a and 14a are limited by positions of the dividing grooves 13 and 14, and the starting and finishing ends 13a and 14a are not necessarily shifted from each other by approximately 180° as long as the starting and finishing ends 13a and 14a are respectively located on the sides A and C.

A length L2 of the dividing groove 13 on the side C of the wound-core member 11 is greater than a length L1 on the side A by a half pitch of the spiral of the coil-forming groove 17. Similarly, a length L3 of the dividing groove 14 on the side A of the wound-core member 11 is greater than a length L4 on the side C by a half pitch of the spiral of the coil-forming groove 17. Thereby, the ends 13a, 13b, 14a, and 14b of the dividing grooves 13 and 14 securely intersect with the coil-forming groove 17. Thus, the thin-film conductor 12 is divided into a region R1 (diagonally shaded area in FIG. 5) surrounded by the dividing groove 13 and the starting end side of the coil-forming groove 17, a region R2 (diagonally shaded area in FIG. 5) surrounded by the dividing groove 14 and the finishing end side of the coil-forming groove 17, and a region of the thin-film coil 22. The regions R1 and R2 and the region of the thin-film coil 22 are electrically insulated from each other.

Figure 6:
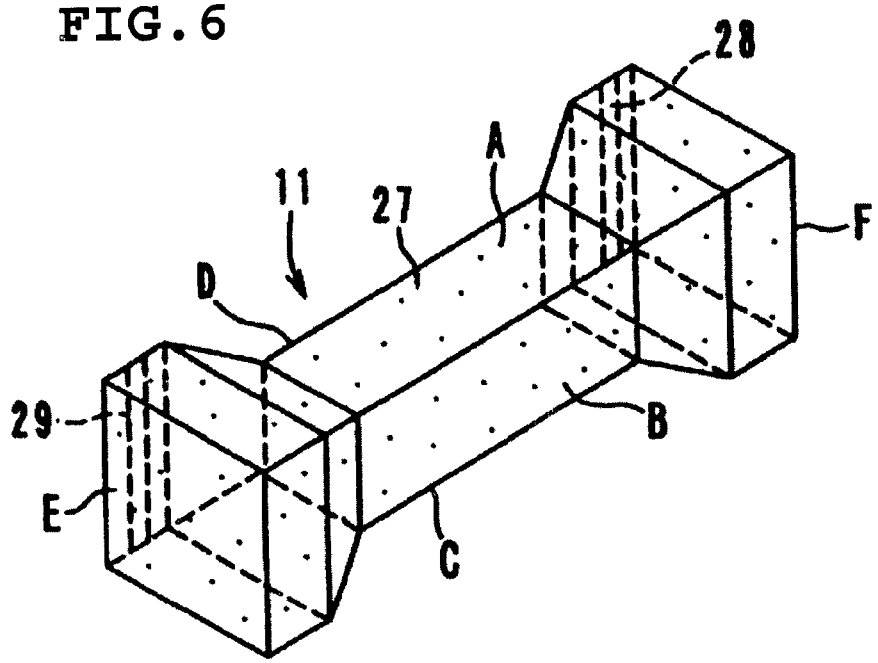
FIG. 6 is a perspective view of the multilayer inductor showing the manufacturing process continued from that shown in FIG. 4.
Figure 7:
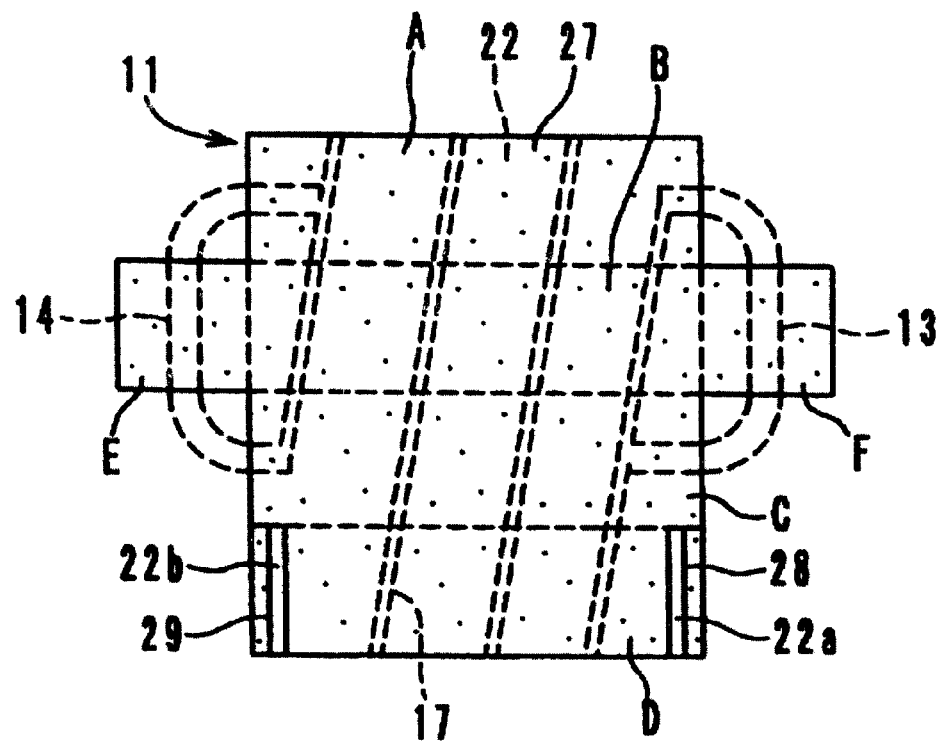
FIG. 7 is a schematic development of the multilayer inductor shown in FIG. 6.

Next, as shown in FIGS. 6 and 7 (FIG. 7 is a schematic development of FIG. 6), an insulation layer 27 is provided on the thin-film conductor 12 having the dividing grooves 13 and 14 and the coil-forming groove 17 provided thereon. The insulation layer 27 has connection openings 28 and 29 which are respectively located at both ends of the side D of the wound-core member 11. In the connection opening 28, a starting end 22a of the thin-film coil 22 is exposed while a finishing end 22b of the thin-film coil 22 is exposed in the connection opening 29. In addition, the shape of the respective connection openings 28 and 29 includes a plurality of straight lines, a spot, or a wave other than one straight line in order to secure the electrical connection to terminal electrodes 41a and 41b (will be described later).

Figure 8:
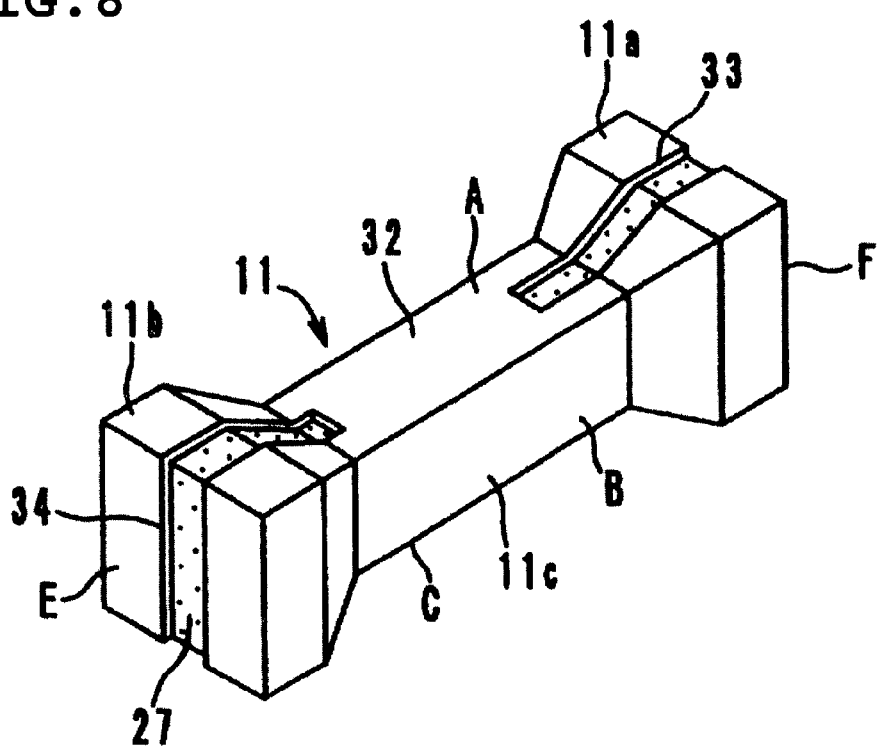
FIG. 8 is a perspective view of the multilayer inductor showing the manufacturing process continued from that shown in FIG. 6.
Figure 9:
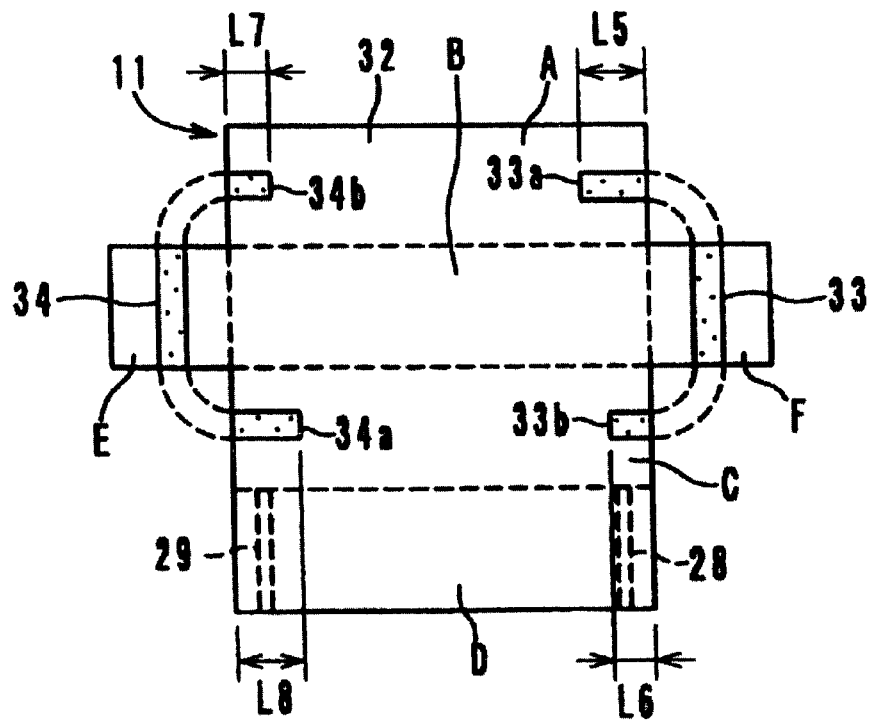
FIG. 9 is a schematic development of the multilayer inductor shown in FIG. 8.

Then, as shown in FIG. 8, on the entire surface of the wound-core member 11, a thin-film conductor 32 is formed preferably via plating, sputtering, or other suitable method. At this time, the connection openings 28 and 29 are also filled with the thin-film conductor 32. Thereafter, the wound-core member 11 is irradiated with a laser beam to form dividing grooves 33 and 34. As shown in FIGS. 8 and 9, from one end side of the coil-winding portion 11c on the side A of the wound-core member 11, the dividing grooves 33 extend through the slope 31 and the flange 11a to extend to one end surface F of the wound-core member 11, and furthermore, it passes around the end surface F to extend to one end side of the coil-winding portion 11c via the flange 11a on the side C of the wound-core member 11 and the slope 31. Similarly, from the other end side of the coil-winding portion 11c on the side C of the wound-core member 11, the dividing groove 34 extends through the slope 31 and the flange 11b to extend to the other end surface E of the wound-core member 11, and furthermore, it passes around the end surface E to extend to the other end side of the coil-winding portion 11c via the flange 11b on the side A and the slope 31.

Also, as shown in FIG. 9, a length L5 of the dividing groove 33 on the side A of the wound-core member 11 is greater than a length L6 on the side C by a half pitch of the spiral of a coil-forming groove 18 (will be described later). Similarly, a length L8 of the dividing groove 34 on the side C of the wound-core member 11 is greater than a length L7 on the side A by a half pitch of the spiral of the coil-forming groove 18. Thereby, the ends 33a, 33b, 34a, and 34b of the dividing grooves 33 and 34 securely intersect the coil-forming groove 18.

Figure 10:
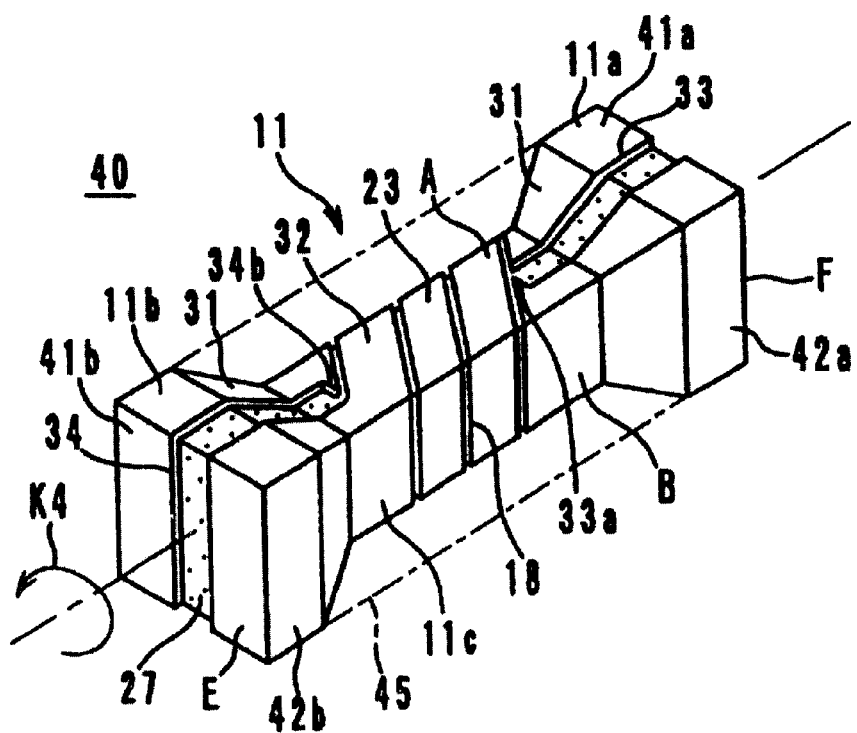
FIG. 10 is a perspective exterior view of the multilayer inductor according to the first preferred embodiment.

Then, as shown in FIG. 10, the wound-core member 11 is irradiated with a laser beam and scanned in the longitudinal direction of the wound-core member 11 while being rotated in the direction of the arrow K4. The portion of the thin-film conductor 32 irradiated with a laser beam is thereby removed to form the spiral groove 18 for defining a coil. Thus, a second thin-film coil 23 spirally winding around the peripheral surface of the coil-winding portion 11c is provided.

Figure 11:
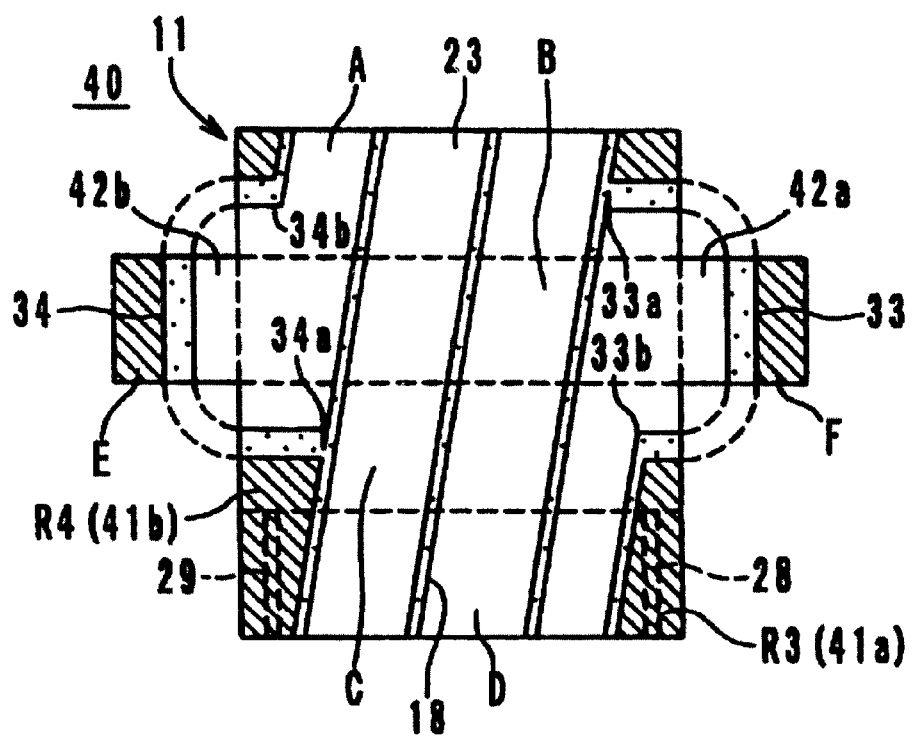
FIG. 11 is a schematic development of the multilayer inductor shown in FIG. 10.

As shown in FIG. 11, from one end 33b of the dividing groove 33 located on the side C of the wound-core member 11 as a starting end, the coil-forming groove 18 extends through the other end 33a of the dividing groove 33 and one end 34a of the dividing groove 34 to extend to the other end 34b of the dividing groove 34 located on the side A of the wound-core member 11 as a finishing end. That is, the starting end 33b of the coil-forming groove 18 is shifted from the finishing end 34a by approximately 180° about the axis of the wound-core member 11.

Thus, the thin-film conductor 32 is divided into a region R3 (diagonally shaded area in FIG. 11) surrounded by the dividing groove 33 and the starting end side of the coil-forming groove 18, a region R4 (diagonally shaded area in FIG. 11) surrounded by the dividing groove 34 and the finishing end side of the coil-forming groove 18, and the region of the thin-film coil 23. The regions R3 and R4 and the region of the thin-film coil 23 are electrically insulated with each other. The regions R3 and R4 are electrically connected to the starting and finishing ends 22a and 22b of the first thin-film coil 22 via the connection openings 28 and 29, respectively. That is, the regions R3 and R4 define the terminal electrodes 41a and 41b of the first thin-film coil 22 while the starting and finishing ends of the second thin-film coil 23 define terminal electrodes 42a and 42b of the thin-film coil 23.

Thereafter, an insulation cover layer 45 is provided thereon except at the flanges 11a and 11b to protect the thin-film coils 22 and 23. At this time, the arrangement of the cover layer 45 is located in the single plane of the flanges 11a and 11b or to be lower than those facilitates the surface mounting operation of a multilayer inductor 40 on a circuit substrate, etc. Furthermore, the terminal electrodes 41a to 42b are given Sn-plating or Ni-Cu-Sn plating, thereby improving solderability, and other characteristics.

Figure 12:
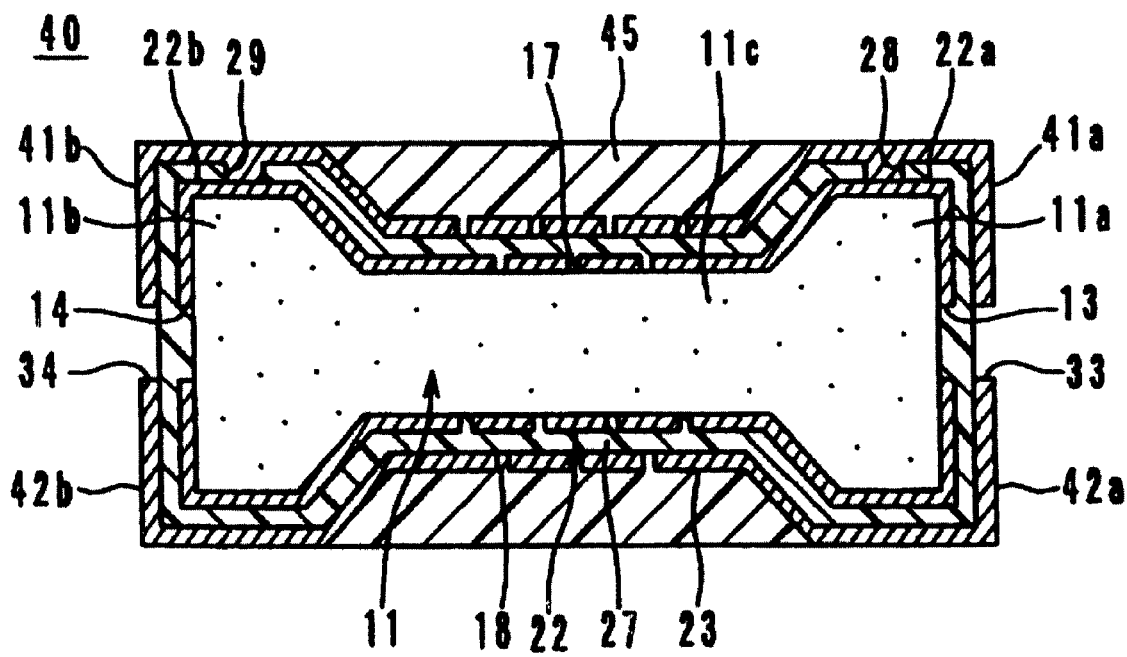
FIG. 12 is a horizontal sectional view of the multilayer inductor shown in FIG. 10.

In the multilayer inductor 40 formed as above, as shown in FIG. 12, two thin-film coils 22 and 23 with the insulation layer 27 interposing therebetween are deposited on the coil-winding portion 11c of the wound-core member 11. At positions opposing the flanges 11a and 11b of the wound-core member 11, the two terminal electrodes 41a and 41b are respectively formed in a state defined by the dividing grooves 33 and 34. To the terminal electrode 41a, the starting end 22a of the first thin-film coil 22 is electrically connected via the connection opening 28 while the finishing end 22b of the first thin-film coil 22 is electrically connected to the terminal electrode 41b via the connection opening 29.

Figure 13:
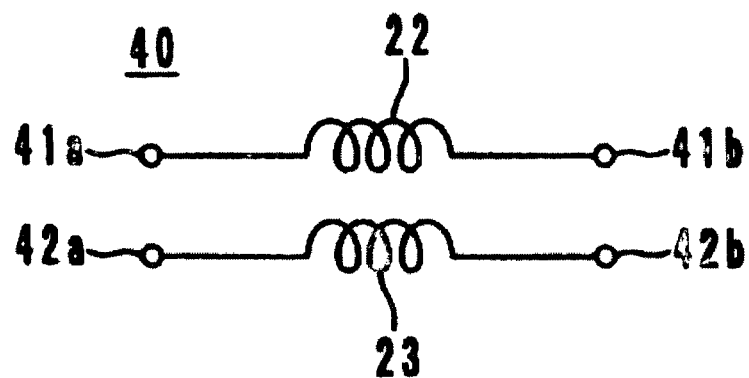
FIG. 13 is an electrical-equivalent-circuit diagram of the multilayer inductor shown in FIG. 10.
Figure 14A:
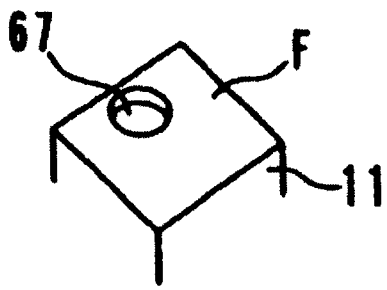
FIGS. 14A to 14D are examples of a distinguishing portion provided on an end surface of a wound-core member.
Figure 14B:
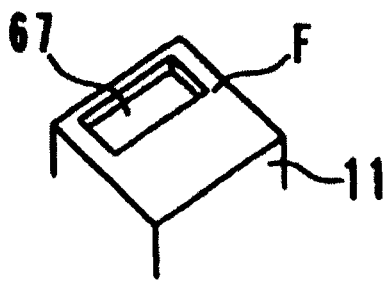
Figure 14C:
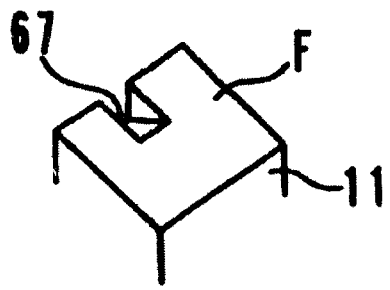
Figure 14D:
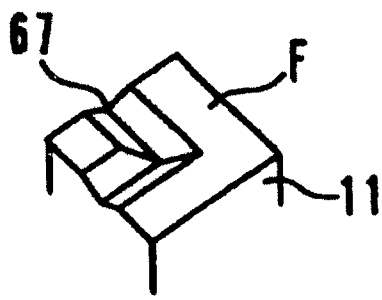
Figure 15A:
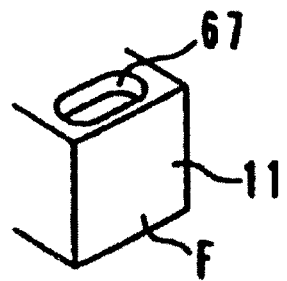
FIGS. 15A to 15D are examples of a distinguishing portion provided on a side of the wound-core member.
Figure 15B:
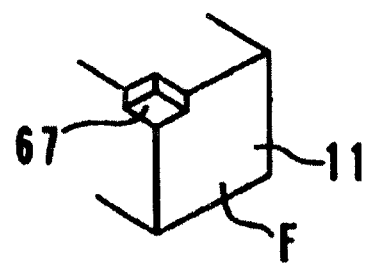
Figure 15C:
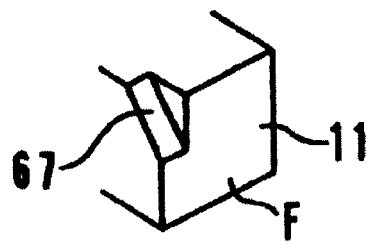
Figure 15D:
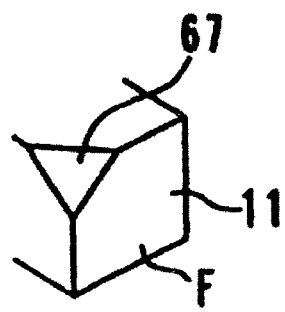

Similarly, at positions opposing the flanges 11a and 11b of the wound-core member 11, the two terminal electrodes 42a and 42b, which are electrically connected to the second thin-film coil 23, are respectively formed in a state defined by the dividing grooves 33 and 34. FIG. 13 is an electrical-equivalent-circuit diagram of the multilayer inductor 40. The thin-film coils 22 and 23 are magnetically connected to each other so that the multilayer inductor 40 functions as a choke coil, or other suitable device.

Since the processing that is required for forming the dividing grooves 13, 14, 33, and 34 and for forming the coil-forming grooves 17 and 18 is complicated, it is preferable that a concave distinguishing portion 67 exemplified in FIGS. 14A to 14D or FIGS. 15A to 15D be formed on one end surface of the wound-core member 11 or on one side thereof in advance. When the distinguishing portion 67 is formed on the end surface of the wound-core member 11, it is arranged to be shifted from the center of the end surface in the vicinity of any one of the four sides. When the distinguishing portion 67 is formed on the side of the wound-core member 11, it is arranged at one end portion of the side. Thereby, the distinguishing portion 67 can distinguish the orientation of the wound-core member 11 and can distinguish the side thereof from the four sides A to D of the wound-core member 11. Therefore, the processing of the dividing grooves 13 and 14 and so forth can be accurately performed by confirming the orientation and the side of the wound-core member 11 in conformity of the distinguishing portion 67. In addition, the shape of the distinguishing portion 67 is arbitrary and may also have a convex shape.

In the multilayer inductor 40, the two thin-film coils 22 and 23 are deposited on the coil-winding portion 11c of the wound-core member 11 with the insulation layer 27 interposed therebetween, so that the length of the wound-core member 11 can be reduced and the number of turns of the thin-film coils 22 and 23 can be increased in comparison with an inductor in which two thin-film coils are arranged in a row in the direction of a wound-core member. Thereby, a small sized multilayer inductor 40 having an even higher inductance can be obtained.

Also, the two thin-film coils 22 and 23 are coaxially arranged about the wound-core member 11 with the insulation layer 27 interposing therebetween, so that the distributed capacity between the thin-film coils 22 and 23 is uniformly generated over the entire portions of the thin-film coils 22 and 23, thereby obtaining a distributed-constant-type multilayer inductor 40. By selecting a material of the insulation layer 27 between the thin-film coils 22 and 23, a different distributed capacity can be obtained, so that a multilayer inductor 40 having a different distributed constant can be obtained.

Furthermore, since the starting ends and the finishing ends of the respective coil-forming grooves 17 and 18 are shifted with respect to each other by approximately 180° in the direction winding about the axis of the wound-core member 11, the terminal electrodes 41a and 41b and the terminal electrodes 42a and 42b to be respectively connected to each of the both ends of the pair of thin-film coils 22 and 23 are located at positions opposing each other of both ends of the wound-core member 11, respectively. Thereby, the terminal electrodes 41a to 42b can have substantially the same shape and substantially the same area, and the corresponding relationship between the terminal electrodes 41a to 42b and the thin-film coils 22 and 23 can be easily distinguished.

In a second preferred embodiment of the present invention, a multilayer inductor is described in which a dividing groove winds around from an end surface of a wound-core member toward an outer peripheral surface thereof. In addition, like reference numerals in FIGS. 16 to 27 showing the structure in the second preferred embodiment designate the same portions corresponding to those in FIGS. 1 to 15D in the first preferred embodiment described above, and repetitive description thereof is omitted.

Figure 16:
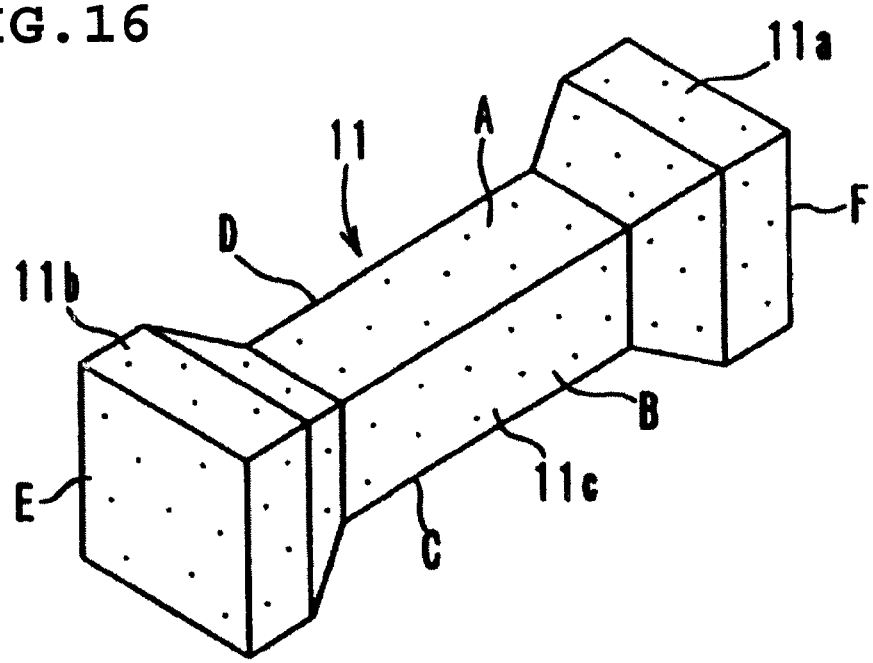
FIG. 16 is a perspective view of a multilayer inductor according to a second preferred embodiment of the present invention showing its manufacturing process.
Figure 17:
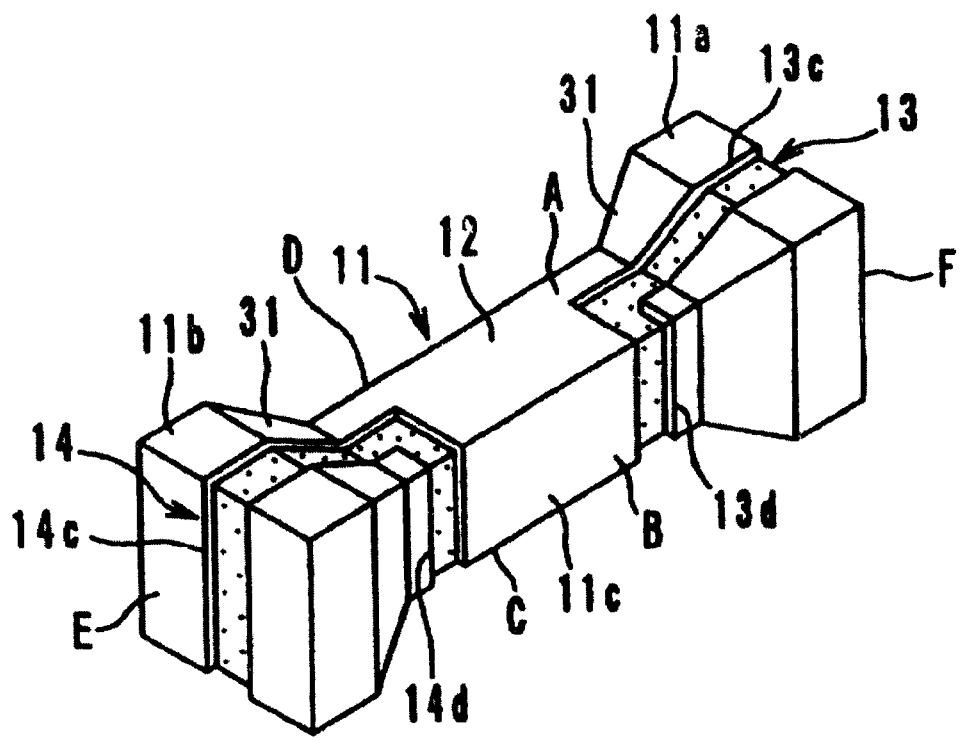
FIG. 17 is a perspective view of the multilayer inductor showing the manufacturing process continued from that shown in FIG. 16.

As shown in FIG. 16, the drum-shaped wound-core member 11 is defined by the coil-winding portion 11c having a substantially square cross-section and the flanges 11a and 11b provided at both ends of the coil-winding portion 11c. After providing an insulation film coated on the surface of the wound-core member 11, as shown in FIG. 17, on the entire surface of the wound-core member 11, the thin-film conductor 12 is formed preferably by plating, sputtering, or other suitable method. The thin-film conductor 12 is preferably made from Cu, Ni, Ag, Ag-Pd, or other suitable material.

Then, the wound core member 11 is inserted into a chuck of a spindle (not shown) of a laser processor. While rotating the spindle and moving the wound-core member 11 in a predetermined direction, the wound-core member 11 is irradiated with a laser beam in sequence of the route indicated by arrows K1 and K2 in FIG. 18. The irradiated portion of the thin-film conductor 12 is thereby removed to form the dividing grooves 13 and 14.

Figure 18:
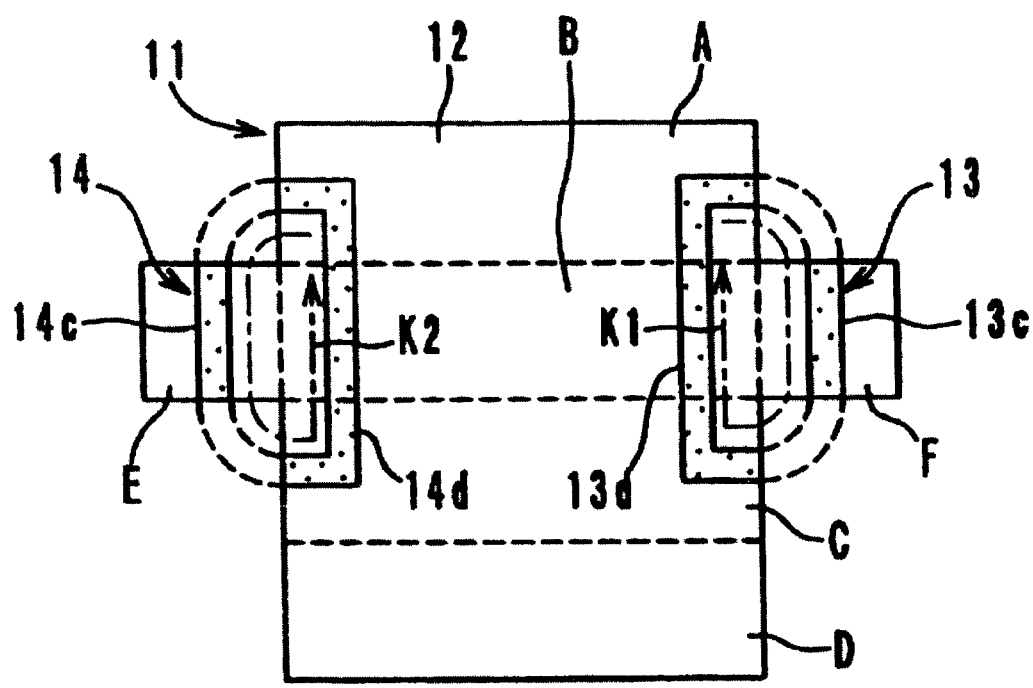
FIG. 18 is a schematic development of the multilayer inductor shown in FIG. 17.

As shown in FIGS. 17 and 18, from the center of one end side of the coil-winding portion 11c on the side A of the wound-core member 11, the dividing groove 13 extends through the slope 31 and the flange 11a extends to an end surface F of the wound-core member 11, and furthermore, it winds around the end surface F to extend to one end side of the coil-winding portion 11c via the flange 11a on the side C of the wound-core member 11 and the slope 31 thereon. This section of the dividing groove 13 will be referred to as an axial dividing groove 13c below. Furthermore, the dividing groove 13 makes a half turn of the coil-winding portion 11c in the direction of its outer periphery, i.e., it winds around the side B from the side C to extend to the original position by extending toward the side A. This section of the dividing groove 13 will be referred to as a winding-dividing groove 13d below. The dividing groove 13 is a winding groove passing through the end surface F and the sides A, B, and C of the wound-core member 11.

Similarly, from the center of the other end side of the coil-winding portion 11c on the side A of the wound-core member 11, the dividing groove 14 extends through the slope 31 and the flange 11b to extend to the other end surface E of the wound-core member 11, and furthermore, it winds around the end surface E to extend to the other end side of the coil-winding portion 11c via the flange 11b and the slope 31. This section of the dividing groove 14 will be referred to as an axial dividing groove 14c below. Furthermore, the dividing groove 14 makes a half turn of the coil-winding portion 11c in the direction of its outer periphery, i.e., it winds around the side B from the side C to extend to the original position by extending toward the side A. This section of the dividing groove 14 will be referred to as a winding-dividing groove 14d below. The dividing groove 14 is a winding groove passing through the end surface E and the sides A, B, and C of the wound-core member 11. In addition, FIG. 18 is a schematic development of FIG. 17, and the unevenness of the flanges 11a and 11b is not shown therein such that the flanges are depicted to be on a single plane of the coil-winding portion 11c.

Figure 19:
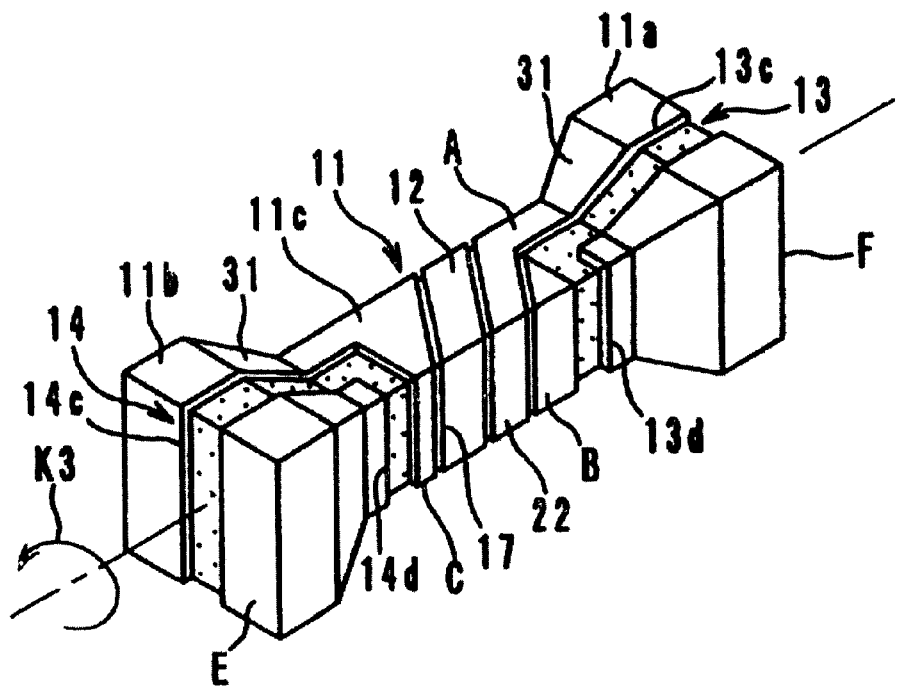
FIG. 19 is a perspective view of the multilayer inductor showing the manufacturing process continued from that shown in FIG. 17.

Then, as shown in FIG. 19, the wound-core member 11 is irradiated with a laser beam and scanned in the longitudinal direction of the wound-core member 11 while being rotated in the direction of arrow K3. The portion of the thin-film conductor 12 irradiated with a laser beam is thereby removed to define the spiral coil-forming groove 17. Thus, the first thin-film coil 22 is arranged to spirally wind around the outer peripheral surface of the coil-winding portion 11c.

Figure 20:
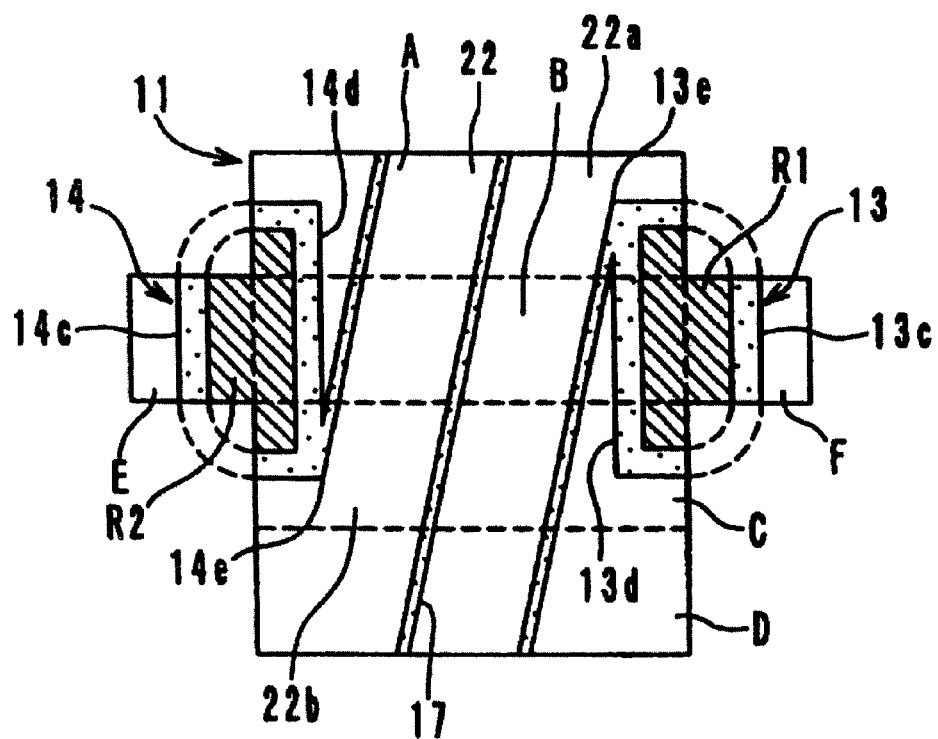
FIG. 20 is a schematic development of the multilayer inductor shown in FIG. 19.

As shown in FIG. 20, from a corner 13e of the dividing groove 13 as a starting end located on the side A of the wound-core member 11, the coil-forming groove 17 reaches a corner 14e of the dividing groove 14 as a finishing end located on the side C of the wound-core member 11. Accordingly, the starting and finishing ends 13e and 14e of the coil-forming groove 17 are shifted from each other by approximately 180° about the axis of the wound-core member 11. In addition, the positions of the starting and finishing ends 13e and 14e may be limited by positions of the dividing grooves 13 and 14, and the starting and finishing ends 13e and 14e are not necessarily shifted from each other by approximately 180° as long as they are respectively located on the sides A and C.

Thus, the thin-film conductor 12 is divided into a region R1 (diagonally shaded area in FIG. 20) surrounded by the dividing groove 13, a region R2 (diagonally shaded area in FIG. 20) surrounded by the dividing groove 14, and a region of the thin-film coil 22. The regions R1 and R2 and the region of the thin-film coil 22 are electrically insulated with each other.

Figure 21:
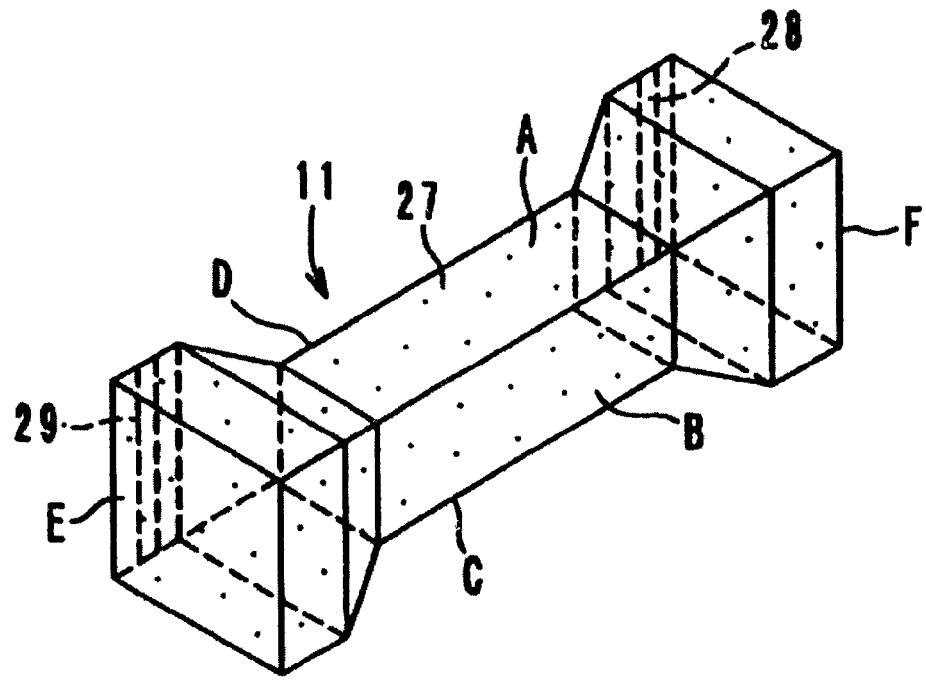
FIG. 21 is a perspective view of the multilayer inductor showing the manufacturing process continued from that shown in FIG. 19.
Figure 22:
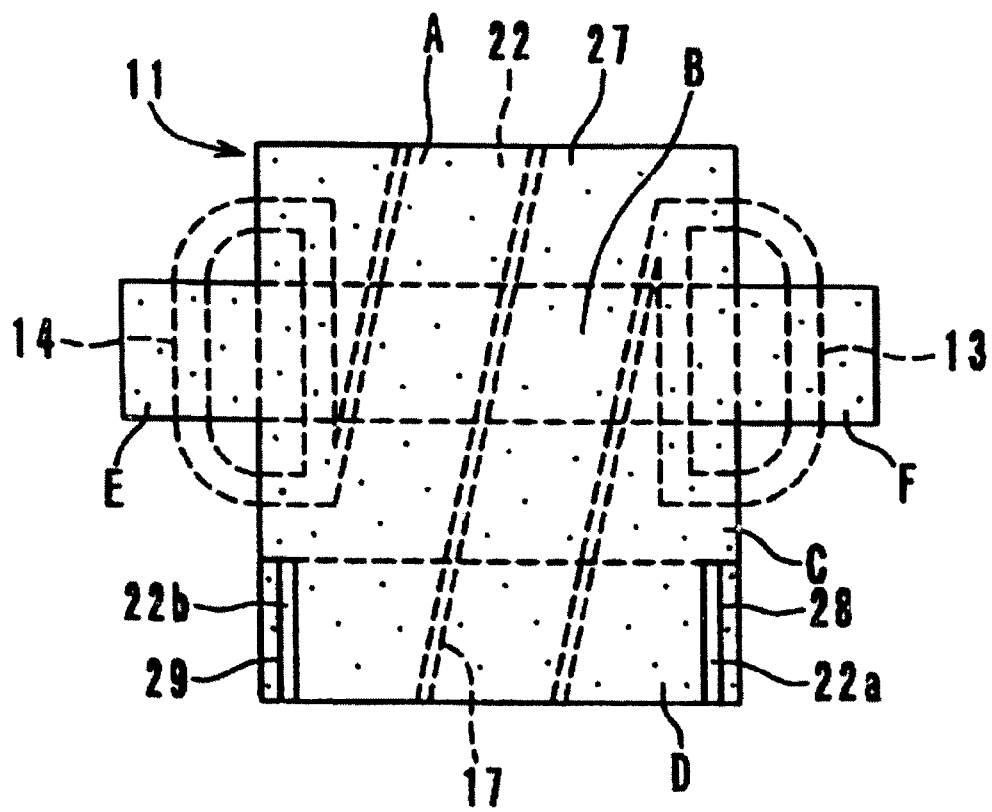
FIG. 22 is a schematic development of the multilayer inductor shown in FIG. 21.

Next, as shown in FIGS. 21 and 22 (FIG. 22 is a schematic development of FIG. 21), the insulation layer 27 is provided on the thin-film conductor 12 having the dividing grooves 13 and 14 and the coil-forming groove 17 provided thereon.

The insulation layer 27 has the connection openings 28 and 29 which are respectively located at both ends of the side D of the wound-core member 11. In the connection opening 28, the starting end 22a of the thin-film coil 22 is exposed while the finishing end 22b of the thin-film coil 22 is exposed in the connection opening 29. In addition, the shape of the respective connection openings 28 and 29 may be a plurality of straight lines, a spot, or a wave other than one straight line in order to secure the electrical connection to the terminal electrodes 41a and 41b, to be described later.

Figure 23:
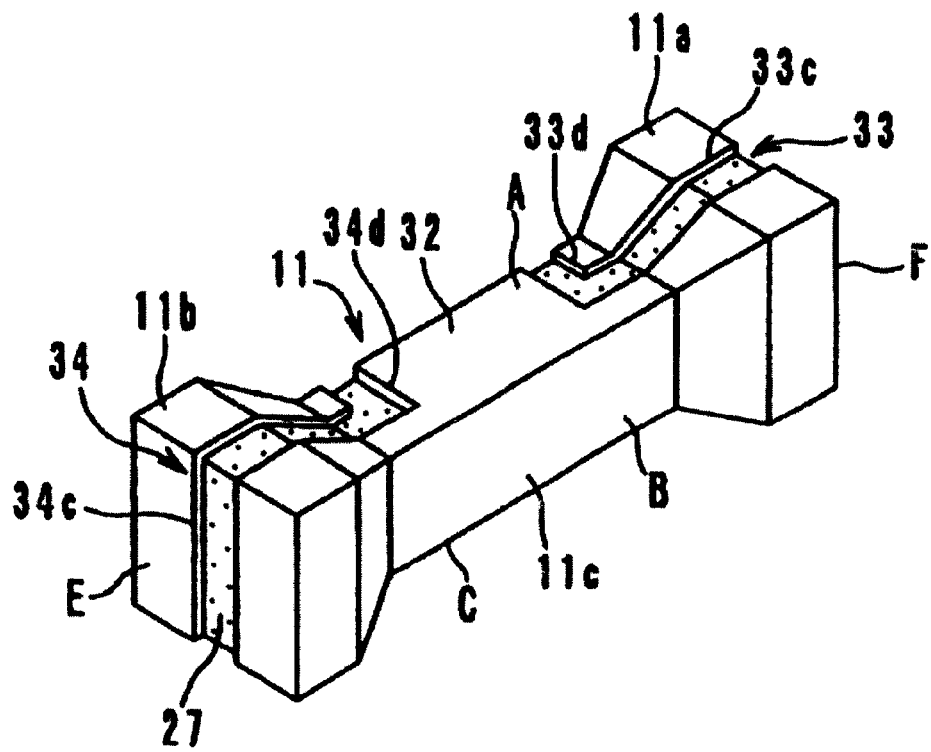
FIG. 23 is a perspective view of the multilayer inductor showing the manufacturing process continued from that shown in FIG. 21.
Figure 24:
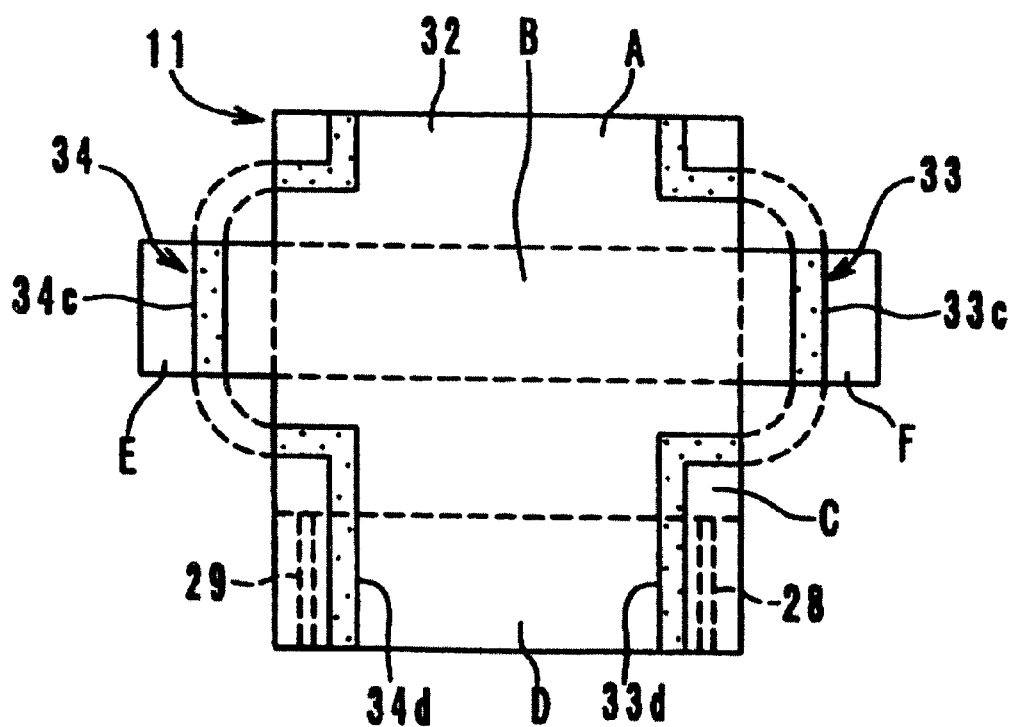
FIG. 24 is a schematic development of the multilayer inductor shown in FIG. 23.

Then, as shown in FIG. 23, on the entire surface of the wound-core member 11, the thin-film conductor 32 is preferably formed by plating, sputtering, or other suitable method. At this time, the connection openings 28 and 29 are also filled with the thin-film conductor 32. Thereafter, the wound-core member 11 is irradiated with a laser beam form the dividing grooves 33 and 34. As shown in FIGS. 23 and 24, from the center in one end side of the coil-winding portion 11c on the side A of the wound-core member 11, the dividing grooves 33 extend through the slope 31 and the flange 11a to extend to one end side of the coil-winding portion 11c. This section of the dividing groove 33 will be referred to as an axial dividing groove 33c below. Furthermore, the dividing groove 33 makes a half turn of the coil-winding portion 11c in the direction of its outer periphery, i.e., it winds around the side D from the side C to extend to the original position by extending toward the side A. The dividing groove 33 is a winding groove passing through the end surface F and the sides A, C, and D of the wound-core member 11.

Similarly, from the center in the other end side of the coil-winding portion 11c on the side A of the wound-core member 11, the dividing groove 34 extends through the slope 31 and the flange 11b to extend to the other end surface E of the wound-core member 11, and furthermore, it winds around the end surface E to extend to the other end side of the coil-winding portion 11c via the flange 11b and the slope 31 on the side C. This section of the dividing groove 34 will be referred to as an axial dividing groove 34c below. Furthermore, the dividing groove 34 makes a half turn of the coil-winding portion 11c in the direction of its outer periphery, i.e., it winds around the side D from the side C to extend to the original position by extending toward the side A. This section of the dividing groove 34 will be referred to as a winding-dividing groove 34d below. The dividing groove 34 is a winding groove passing through the end surface E and the sides A, C, and D of the wound-core member 11.

Figure 25:
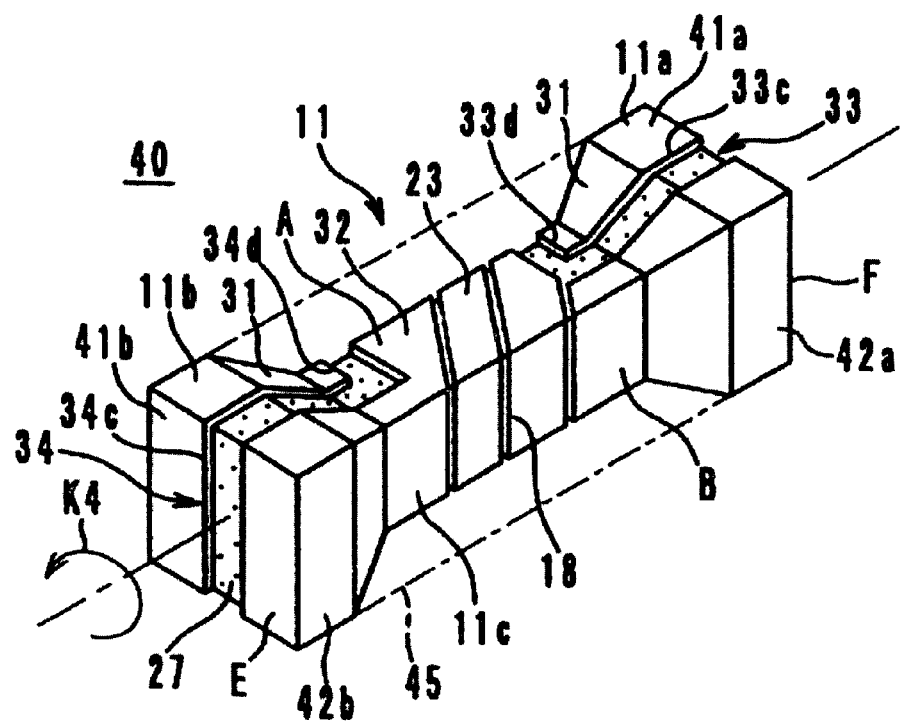
FIG. 25 is a perspective exterior view of the multilayer inductor according to the second preferred embodiment.

Then, as shown in FIG. 25, the wound-core member 11 is irradiated with a laser beam and scanned in the longitudinal direction of the wound-core member 11 while being rotated in the direction of arrow K4. The portion of the thin-film conductor 32 irradiated with a laser beam is thereby removed to form the spiral coil-forming groove 18. Thus, the second thin-film coil 23 is arranged to spirally wind around the outer peripheral surface of the coil-winding portion 11c.

Figure 26:
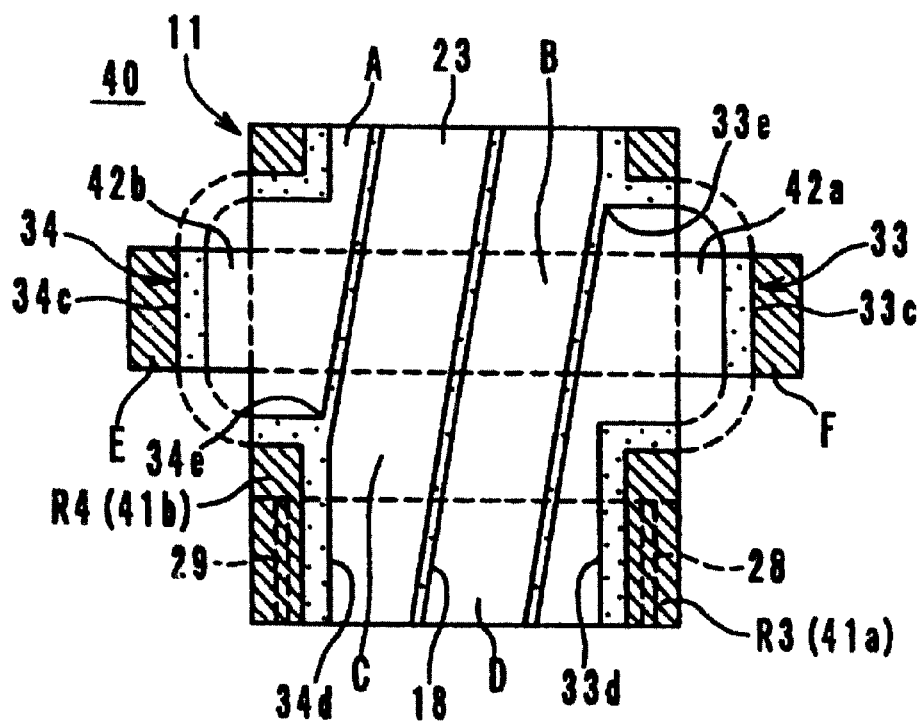
FIG. 26 is a schematic development of the multilayer inductor shown in FIG. 25.
Figure 27:
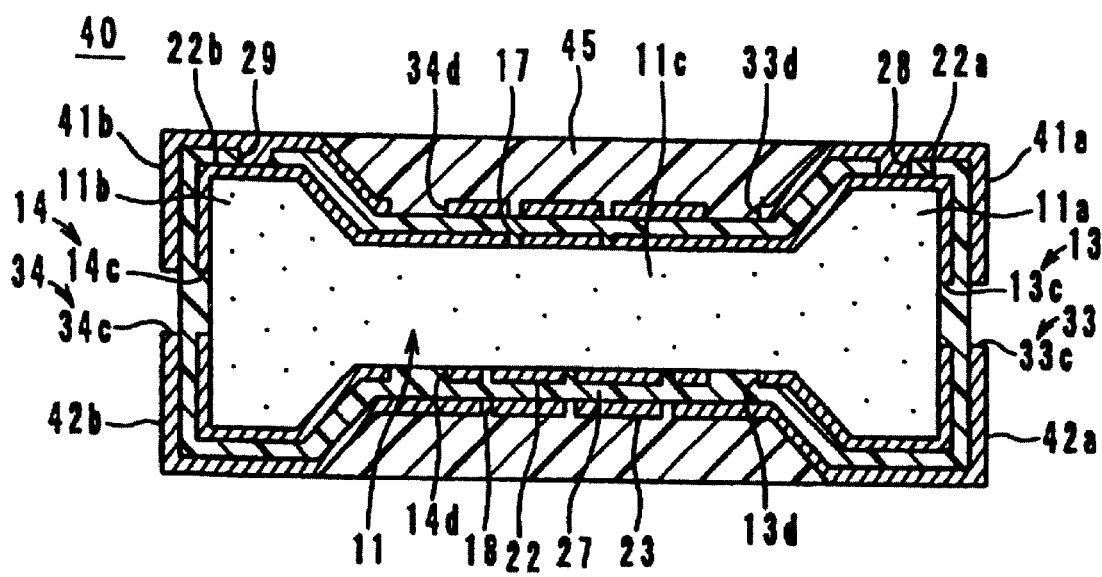
FIG. 27 is a horizontal sectional view of the multilayer inductor shown in FIG. 25.

As shown in FIG. 26, from a corner 33e of the dividing groove 33 as a starting end located on the side A of the wound-core member 11, the coil-forming groove 18 reaches a corner 34e of the dividing groove 34 as a finishing end located on the side C of the wound-core member 11. That is, the starting and finishing ends 33e and 34e of the coil-forming groove 18 are shifted from each other by approximately 180° about the axis of the wound-core member 11. Also, the starting end 33e of the coil-forming groove 18 and the starting end 13e of the coil-forming groove 17 are located on the same plane (side A) of the wound-core member 11.

Thus, the thin-film conductor 32 is divided into a region R3 (diagonally shaded area in FIG. 26) surrounded by the dividing groove 33, a region R4 (diagonally shaded area in FIG. 26) surrounded by the dividing groove 34, and a region of the thin-film coil 23. The regions R3 and R4 and the region of the thin-film coil 23 are electrically insulated with each other. The regions R3 and R4 are electrically connected to the starting and finishing ends 22a and 22b of the first thin-film coil 22 via the connection openings 28 and 29, respectively. That is, the regions R3 and R4 are to be the terminal electrodes 41a and 41b of the first thin-film coil 22 while the starting and finishing ends of the regions in the second thin-film coil 23 are to be terminal electrodes 42a and 42b of the thin-film coil 23.

Thereafter, the insulation cover layer 45 is provided thereon except the flanges 11a and 11b to protect the thin-film coils 22 and 23. Furthermore, the terminal electrodes 41a to 42b are provided with Sn-plating or Ni-Cu-Sn plating, thereby greatly improving solderability.

In the multilayer inductor 40 formed as described above, as shown in FIG. 27, the two thin-film coils 22 and 23 with the insulation layer 27 interposed therebetween are deposited on the coil-winding portion 11c of the wound-core member 11. At positions opposing the flanges 11a and 11b of the wound-core member 11, the two terminal electrodes 41a and 41b are respectively provided and defined by the dividing grooves 33 and 34. To the terminal electrode 41a, the starting end 22a of the first thin-film coil 22 is electrically connected via the connection opening 28 while the finishing end 22b of the first thin-film coil 22 is electrically connected to the terminal electrode 41b via the connection opening 29. Similarly, at positions opposing the flanges 11a and 11b of the wound-core member 11, the two terminal electrodes 42a and 42b, which are electrically connected to the second thin-film coil 23, are respectively provided and defined by the dividing grooves 33 and 34. Consequently, the multilayer inductor 40 according to the second preferred embodiment achieves the same advantages and benefits as achieved in the first preferred embodiment.

In a third preferred embodiment of the present invention, the axial dividing grooves 13c and 33c in the second preferred embodiment are formed simultaneously and the axial dividing groove 14c and 34c are formed simultaneously. In addition, like reference characters in FIGS. 28 to 36 showing the structure in the third preferred embodiment designate like portions corresponding to those in FIGS. 16 to 27 in the second preferred embodiment described above, and repetitive description thereof is omitted.

Figure 28:
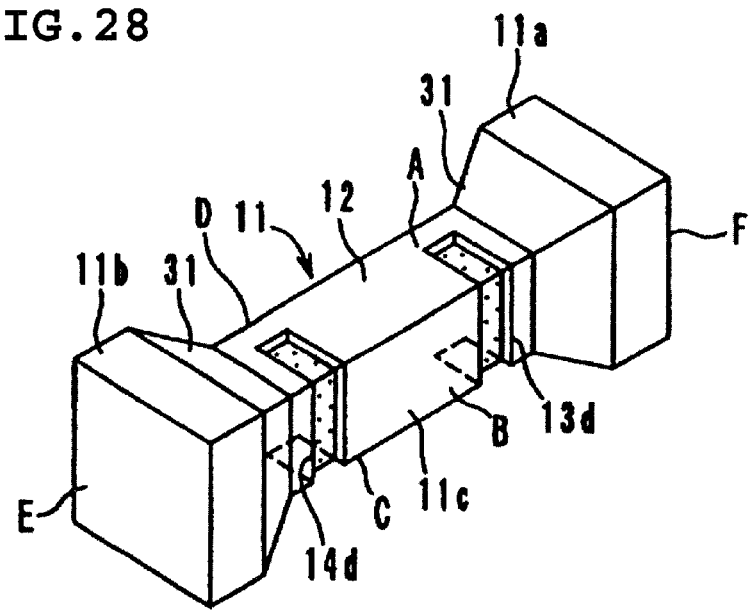
FIG. 28 is a perspective view of a multilayer inductor according to a third preferred embodiment of the present invention showing its manufacturing process.

As shown in FIG. 28, on the entire surface of the wound-core member 11, the thin-film conductor 12 is preferably formed by plating, or other suitable method. Thereafter, both ends of the coil-winding portion 11c of the wound-core member 11 are irradiated with a laser beam. The irradiated portion of the thin-film conductor 12 is thereby removed to form only the winding-dividing grooves 13d and 14d of the dividing grooves 13 and 14. That is, from the center in one end side on the side A of the coil-winding portion 11c, the winding-dividing groove 13d winds around the side B and makes a half turn of the coil-winding portion 11c in the outer peripheral direction to extend to the center of the side C. Similarly, from the center in the other end side on the side A of the coil-winding portion 11c, the winding-dividing groove 14d winds around the side B to extend to the center of the side C.

Figure 29:
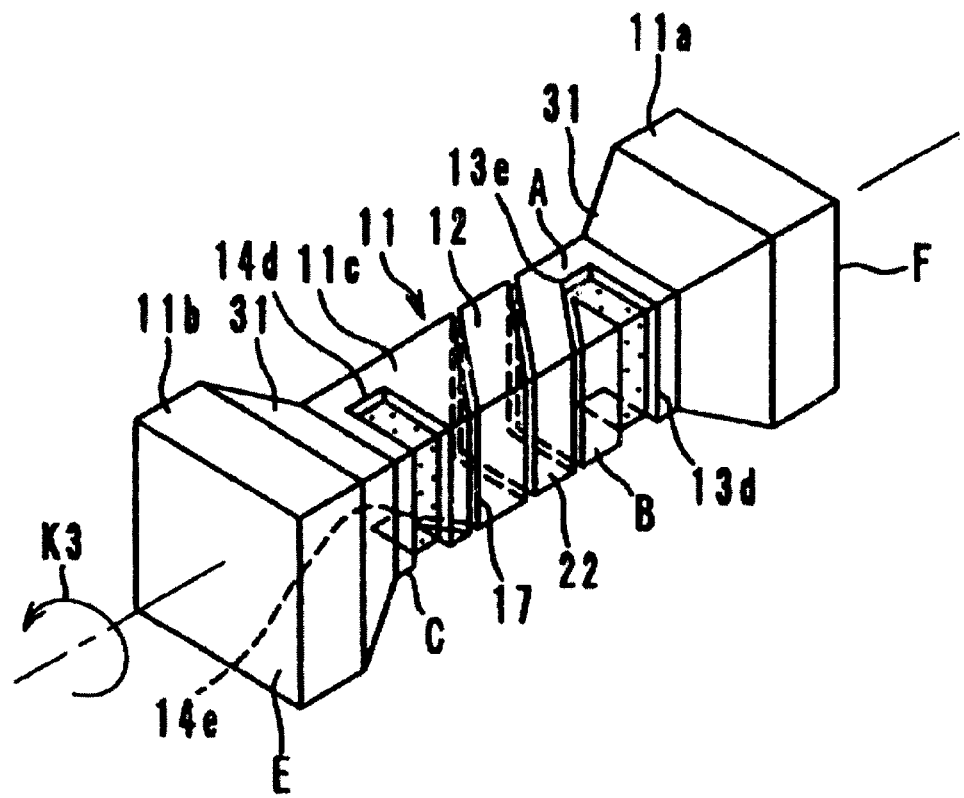
FIG. 29 is a perspective view of the multilayer inductor showing the manufacturing process continued from that shown in FIG. 28.

Then, as shown in FIG. 29, the wound-core member 11 is irradiated with a laser beam and scanned in the longitudinal direction of the wound-core member 11 while being rotated in the direction of arrow K3. The portion of the thin-film conductor 12 irradiated with a laser beam is thereby removed to form the spiral coil-forming groove 17. Thus, the first thin-film coil 22 spirally winds around the outer peripheral surface of the coil-winding portion 11c.

Figure 30:
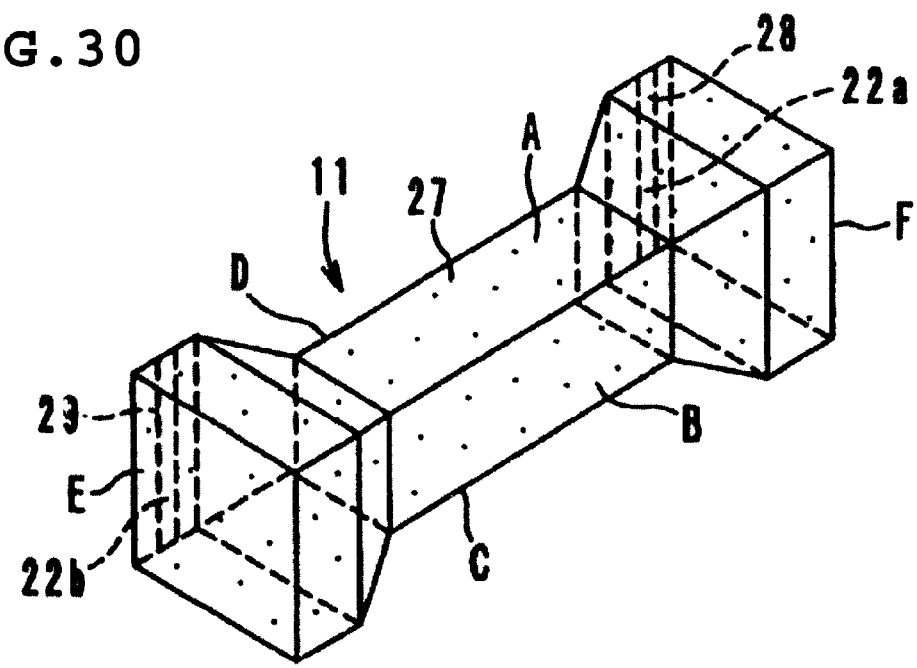
FIG. 30 is a perspective view of the multilayer inductor showing the manufacturing process continued from that shown in FIG. 29.

Next, as shown in FIG. 30, the insulation layer 27 is provided on the thin-film conductor 12 having the winding-dividing grooves 13d and 14d and the coil-forming groove 17 formed thereon. The insulation layer 27 has the connection openings 28 and 29 which are respectively located at both ends of the side D of the wound-core member 11. In the connection opening 28, the starting end 22a of the thin-film coil 22 is exposed while the finishing end 22b of the thin-film coil 22 is exposed in the connection opening 29.

Figure 31:
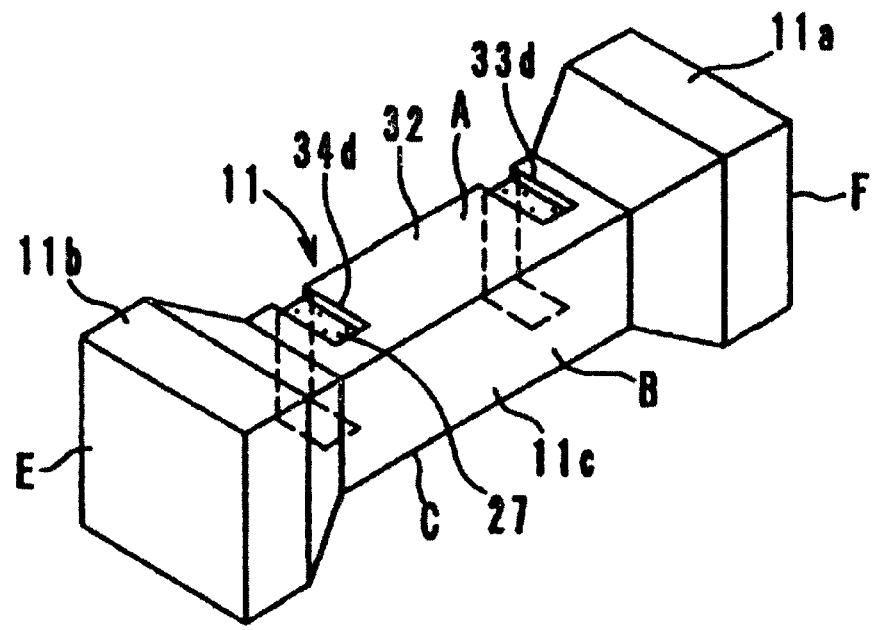
FIG. 31 is a perspective view of the multilayer inductor showing the manufacturing process continued from that shown in FIG. 30.

Then, as shown in FIG. 31, on the entire surface of the wound-core member 11, the thin-film conductor 32 is preferably formed via plating, or other suitable method. At this time, the connection openings 28 and 29 are also filled with the thin-film conductor 32. Thereafter, the wound-core member 11 is irradiated with a laser beam so as to form only winding-dividing grooves 33d and 34d of the dividing grooves 33 and 34. That is, from the center of one end side on the side A of the coil-winding portion 11c, the winding-dividing groove 33d winds around the side D and makes a half turn of the coil-winding portion 11c in the outer peripheral direction so as to reach the center of the side C. Similarly, from the center of the other end side on the side A of the coil-winding portion 11c, the winding-dividing groove 34d winds around the side D to extend to the center of the side C.

Figure 32:
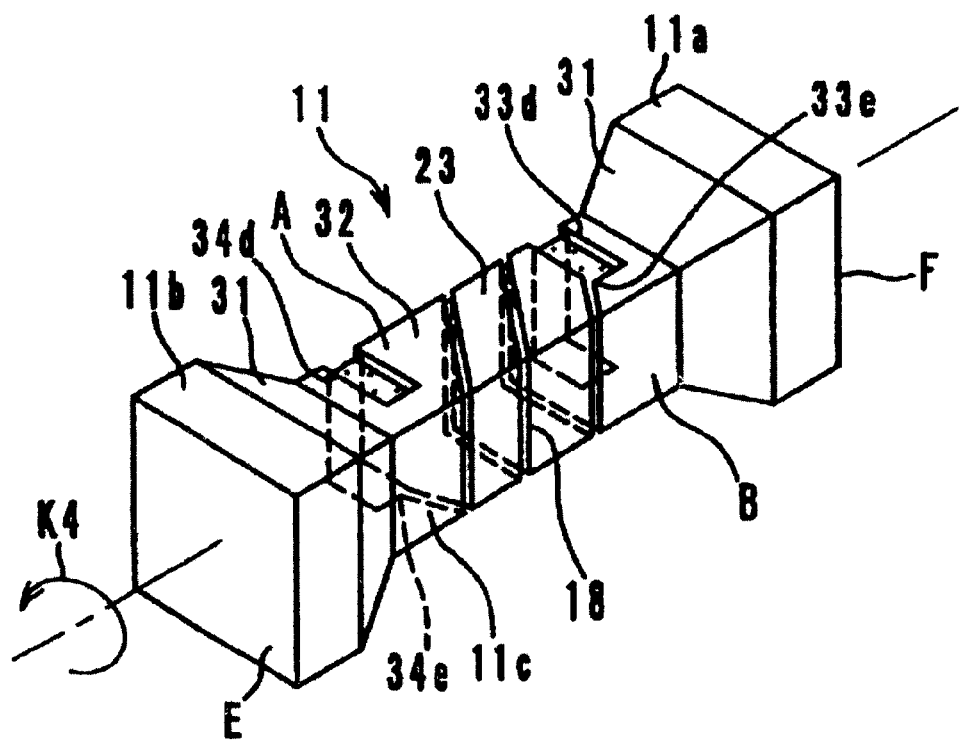
FIG. 32 is a perspective view of the multilayer inductor showing the manufacturing process continued from that shown in FIG. 31.

Then, as shown in FIG. 32, the wound-core member 11 is irradiated with a laser beam and scanned in the longitudinal direction of the wound-core member 11 while being rotated in the direction of arrow K4. The portion of the thin-film conductor 32 irradiated with a laser beam is thereby removed to form the spiral coil-forming groove 18. Thus, the second thin-film coil 23 spirally winds around the outer peripheral surface of the coil-winding portion 11c.

Figure 33:
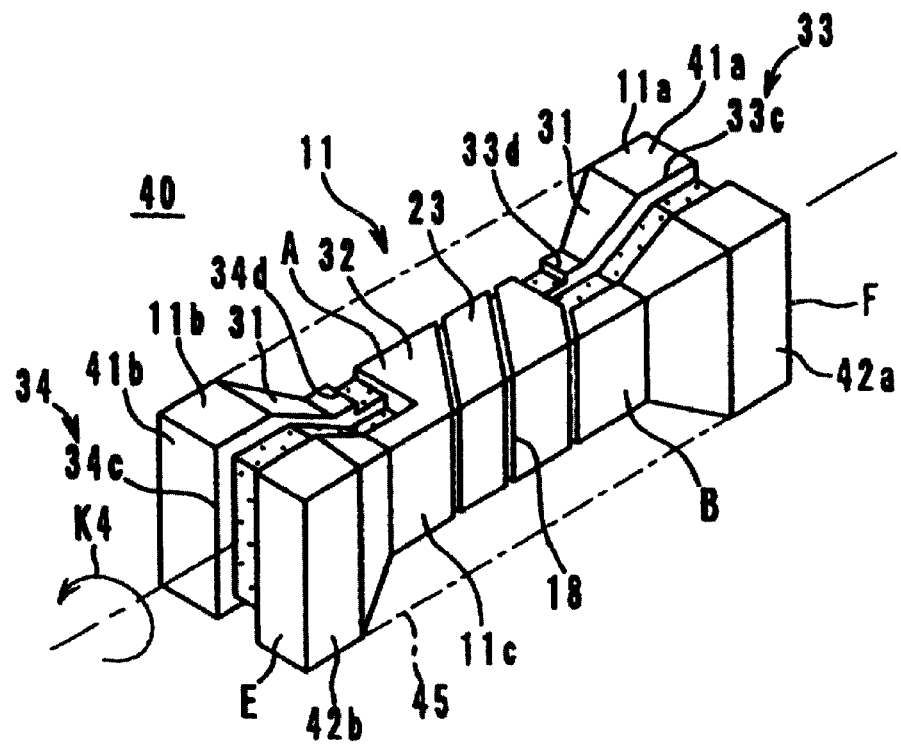
FIG. 33 is a perspective exterior view of the multilayer inductor according to the third preferred embodiment.
Figure 34:
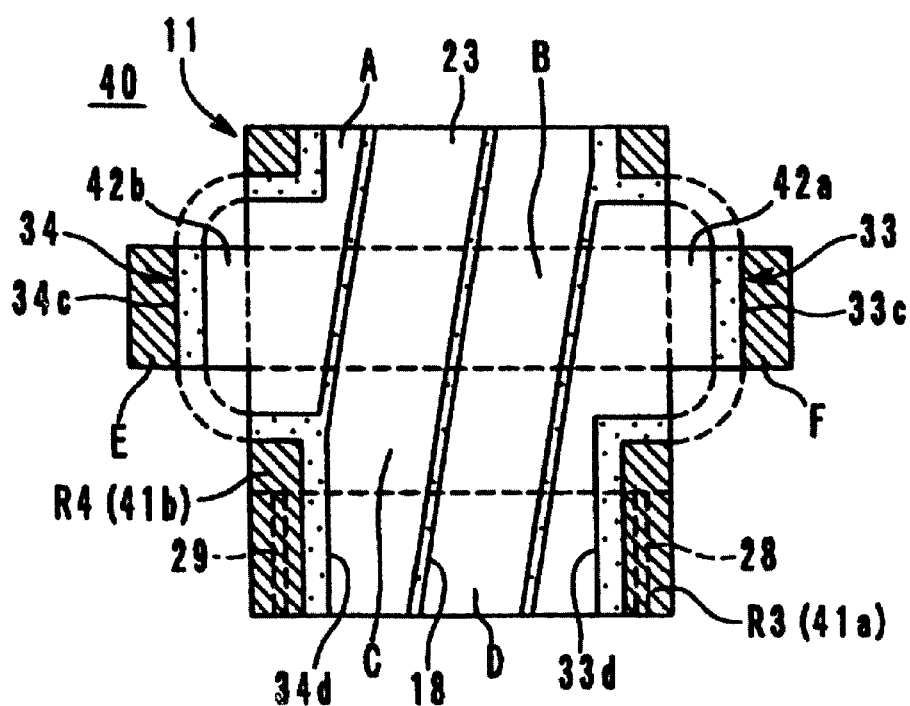
FIG. 34 is a schematic development of the multilayer inductor shown in FIG. 33.
Figure 35:
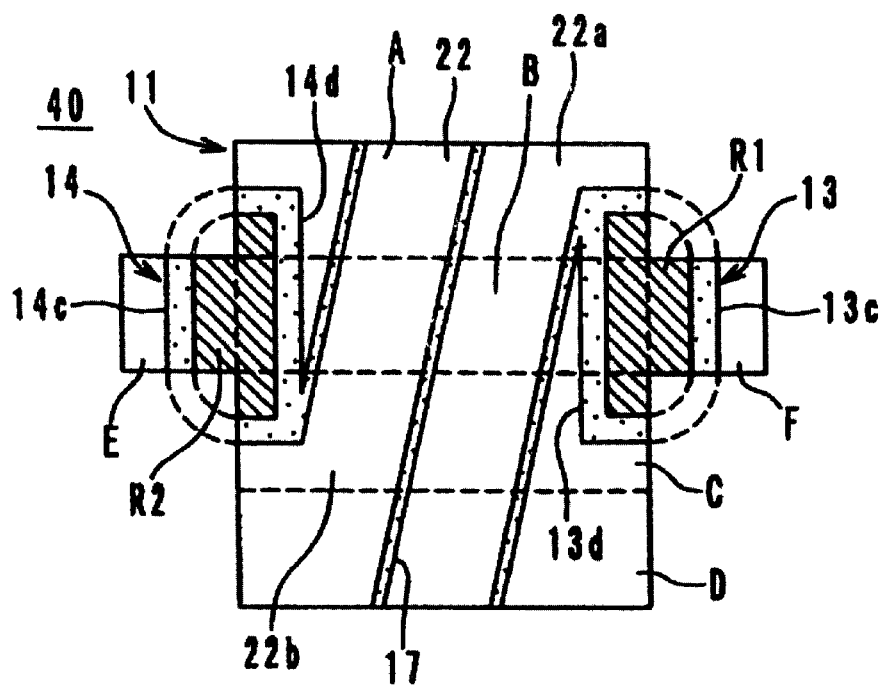
FIG. 35 is a schematic development of a layer on which a first thin-film coil of the multilayer inductor shown in FIG. 33 is provided.

Thereafter, as shown in FIG. 33, a laser beam illuminates the wound-core member 11 in the following sequence. That is, from one end of the winding-dividing groove 33d as a starting end located on the side A of the wound-core member 11, a laser beam is extended through the slope 31 and the flange 11a to extend to one end surface F of the wound-core member 11, and furthermore, it winds around the end surface F to extend to the other end of the winding-dividing groove 33d as a finishing end via the flange 11a on the side C of the wound-core member 11 and the slope 31 thereon to form the axial dividing groove 33c of the dividing grooves 33 by irradiating the wound-core member 11 with the laser beam. At this time, by adjusting the intensity and the irradiation time of the laser beam to increase the processing depth, the insulation layer 27 and the thin-film conductor 12 are simultaneously removed with the laser beam. Thereby, as shown in FIGS. 34 and 35, the axial dividing groove 13c of the dividing groove 13 is also formed simultaneously with the axial dividing groove 33c of the dividing groove 33. FIG. 34 is a schematic development of the multilayer inductor shown in FIG. 33 and FIG. 35 is a schematic development of a layer on which the first thin-film coil 22 of the multilayer inductor is provided.

Similarly, as shown in FIG. 33, from one end of the winding-dividing groove 34d as a starting end located on the side A of the wound-core member 11, a laser beam is extended through the slope 31 and the flange 11b to extend to the other end face E of the wound-core member 11, and furthermore, it winds around the end face E to extend to the other end of the winding-dividing groove 34d as a finishing end via the flange 11b on the side C of the wound-core member 11 and the slope 31 thereon to define the axial dividing groove 34c of the dividing grooves 34 by irradiating the wound-core member 11 with the laser beam. At this time, the insulation layer 27 and the thin-film conductor 12 are also removed with the laser beam. Thereby, as shown in FIGS. 34 and 35, the axial dividing groove 14c of the dividing groove 14 is also formed simultaneously with the axial dividing groove 34c of the dividing groove 34.

Figure 36:
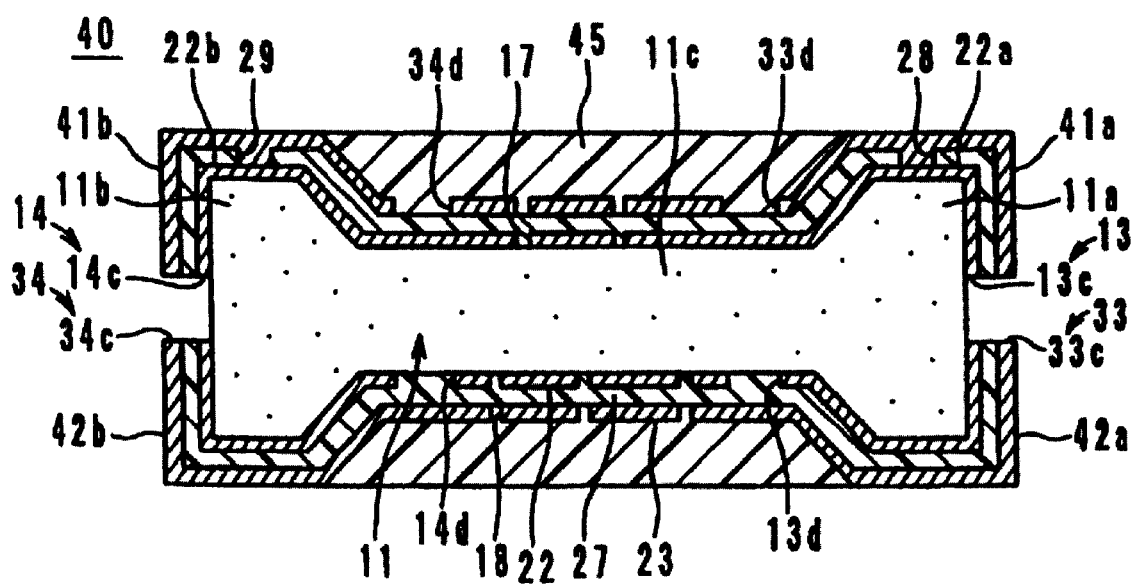
FIG. 36 is a horizontal sectional view of the multilayer inductor shown in FIG. 33.

Thus, the thin-film conductor 32 is divided into the region R3 (diagonally shaded area in FIG. 34) surrounded by the dividing groove 33, the region R4 (diagonally shaded area in FIG. 34) surrounded by the dividing groove 34, and the region of the thin-film coil 23. The regions R3 and R4 and the region of the thin-film coil 23 are electrically insulated with each other. Similarly, the thin-film conductor 12 is divided into the region R1 (diagonally shaded area in FIG. 35) surrounded by the dividing groove 13, the region R2 (diagonally shaded area in FIG. 35) surrounded by the dividing groove 14, and the region of the thin-film coil 22. The regions R1 and R2 and the region of the thin-film coil 22 are electrically insulated with each other. As shown in FIG. 34, the regions R3 and R4 are electrically connected to the starting and finishing ends 22a and 22b of the first thin-film coil 22 via the connection openings 28 and 29, respectively. That is, the regions R3 and R4 define the terminal electrodes 41a and 41b of the first thin-film coil 22 while the starting and finishing ends of the regions in the second thin-film coil 23 define terminal electrodes 42a and 42b of the thin-film coil 23. FIG. 36 is a horizontal sectional view of the multilayer inductor 40 shown in FIG. 33.

In the multilayer inductor 40 formed as described above, the axial dividing grooves 13c and 33c are simultaneously formed while the axial dividing groove 14c and 34c are simultaneously formed, such that the number of process steps is greatly decreased, thereby greatly reducing the manufacturing cost to obtain an inexpensive multilayer inductor 40.

In a fourth preferred embodiment, the axial dividing grooves 13c and 33c in the second preferred embodiment are simultaneously formed while the axial dividing groove 14c and 34c are simultaneously formed, and furthermore, the coil-forming grooves 17 and 18 are also formed simultaneously. In addition, like reference numerals in FIGS. 37 to 46 showing the structure in the fourth preferred embodiment designate like portions corresponding to those in FIGS. 16 to 27 in the second preferred embodiment described above, and repetitive description thereof is omitted.

Figure 37:
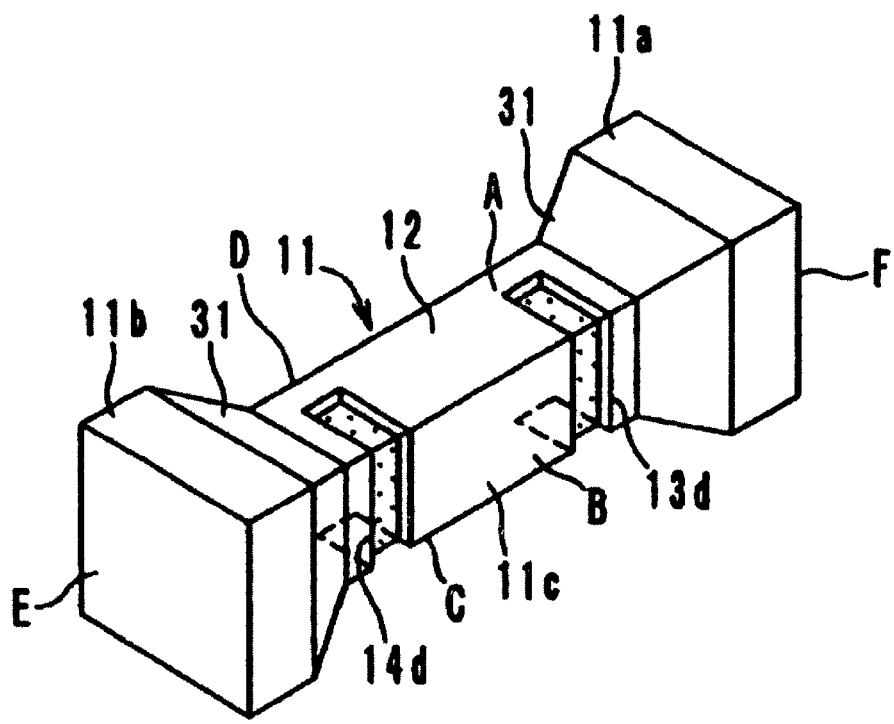
FIG. 37 is a perspective view of a multilayer inductor according to a fourth preferred embodiment of the present invention showing its manufacturing process.

As shown in FIG. 37, on the entire surface of the wound-core member 11, the thin-film conductor 12 is provided via plating, or other suitable method. Thereafter, both ends of the coil-winding portion 11c of the wound-core member 11 are irradiated with a laser beam. The irradiated portion of the thin-film conductor 12 is thereby removed to form only the winding-dividing grooves 13d and 14d of the dividing grooves 13 and 14. That is, from the center in one end side on the side A of the coil-winding portion 11c, the winding-dividing groove 13d winds around the side B and makes a half turn of the coil-winding portion 11c in the outer peripheral direction to extend to the center of the side C. Similarly, from the center in the other end side on the side A of the coil-winding portion 11c, the winding-dividing groove 14d winds around the side B to extend to the center of the side C.

Figure 38:
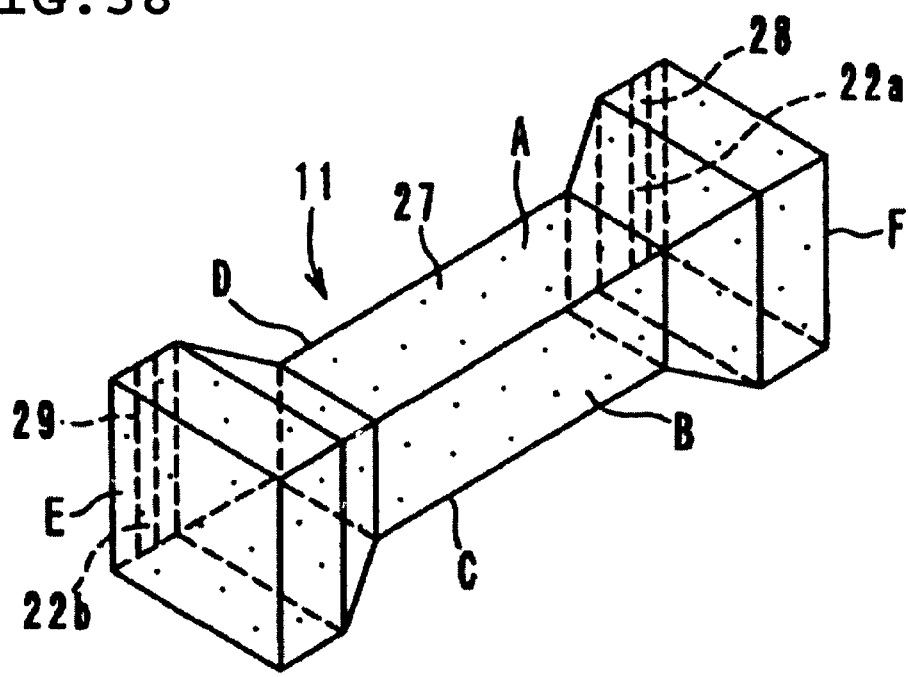
FIG. 38 is a perspective view of the multilayer inductor showing the manufacturing process continued from that shown in FIG. 37.

Next, as shown in FIG. 38, the insulation layer 27 is provided on the thin-film conductor 12 having the winding-dividing grooves 13d and 14d provided thereon. The insulation layer 27 has the connection openings 28 and 29 which are respectively located at both ends of the side D of the wound-core member 11. In the connection opening 28, the starting end 22a, which will be described later, of the thin-film coil 22 is exposed while the finishing end 22b of the thin-film coil 22 is exposed in the connection opening 29.

Figure 39:
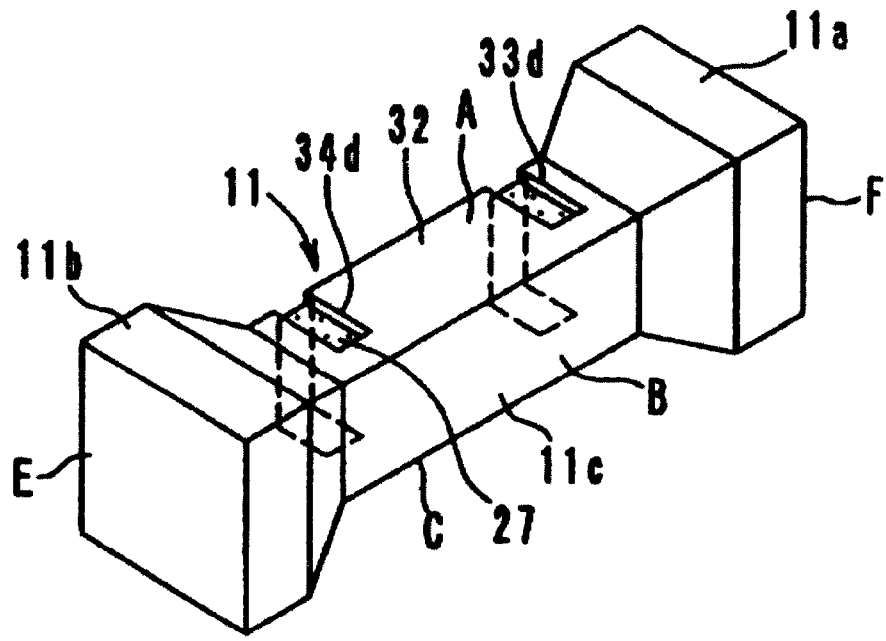
FIG. 39 is a perspective view of the multilayer inductor showing the manufacturing process continued from that shown in FIG. 38.

Then, as shown in FIG. 39, on the entire surface of the wound-core member 11, the thin-film conductor 32 is preferably formed via plating, or other suitable method. At this time, the connection openings 28 and 29 are also filled with the thin-film conductor 32. Thereafter, the wound-core member 11 is irradiated with a laser beam to form only winding-dividing grooves 33d and 34d of the dividing grooves 33 and 34. That is, from the center in one end side on the side A of the coil-winding portion 11c, the winding-dividing groove 33d winds around the side D and makes a half turn of the coil-winding portion 11c in the outer peripheral direction so as to reach the center of the side C. Similarly, from the center in the other end side on the side A of the coil-winding portion 11c, the winding-dividing groove 34d winds around the side D to extend to the center of the side C.

Figure 40:
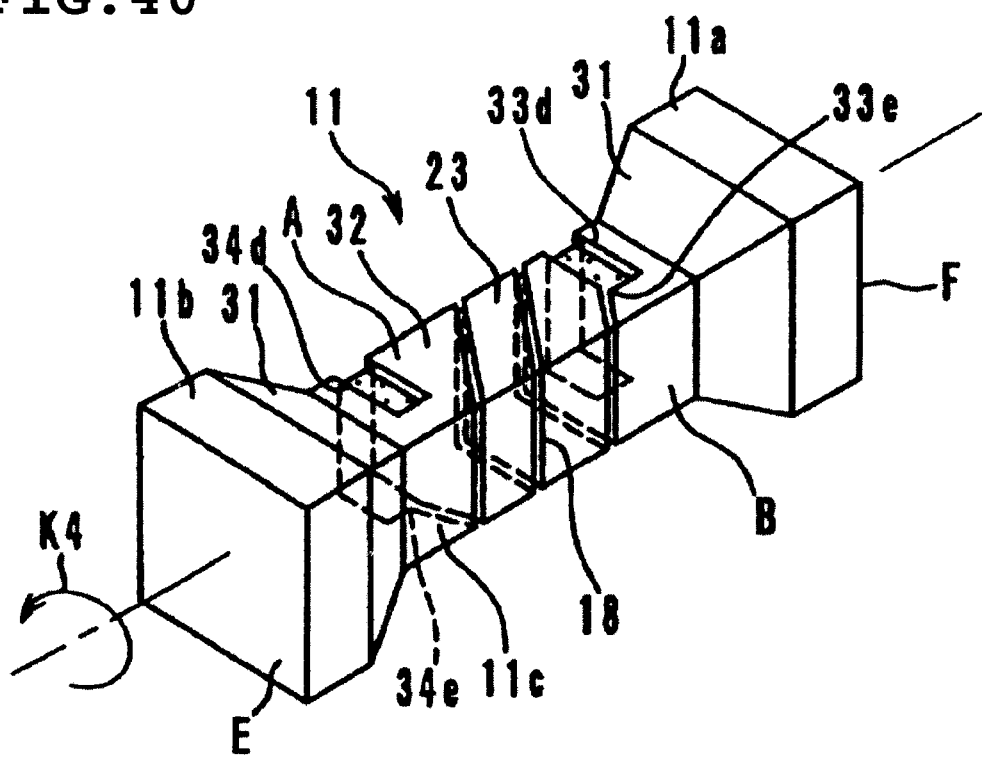
FIG. 40 is a perspective view of the multilayer inductor showing the manufacturing process continued from that shown in FIG. 39.
Figure 41:
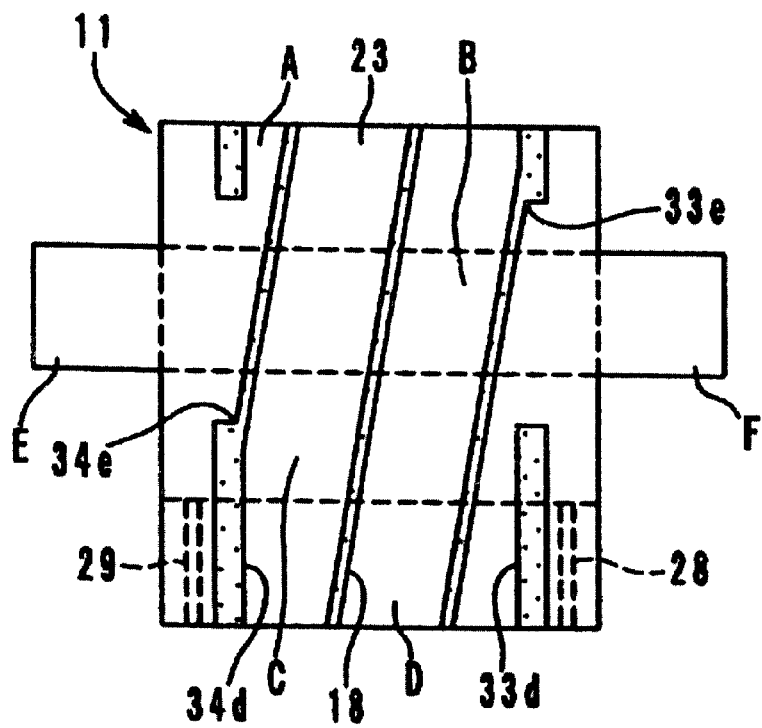
FIG. 41 is a schematic development of the multilayer inductor shown in FIG. 40.

Then, as shown in FIG. 40, the wound-core member 11 is irradiated with a laser beam and scanned in the longitudinal direction of the wound-core member 11 while being rotated in the direction of arrow K4. That is, from a corner 33e of the winding-dividing groove 33d as a starting end located on the side A of the wound-core member 11, a laser beam is extended so as to reach a corner 34e of the winding-dividing groove 33d as a finishing end located on the side C of the wound-core member 11, to form the coil-forming groove 18 by irradiating it with the laser beam. As shown in FIG. 41, the second thin-film coil 23 spirally winding around the peripheral surface of the coil-winding portion 11c is provided.

Figure 42:
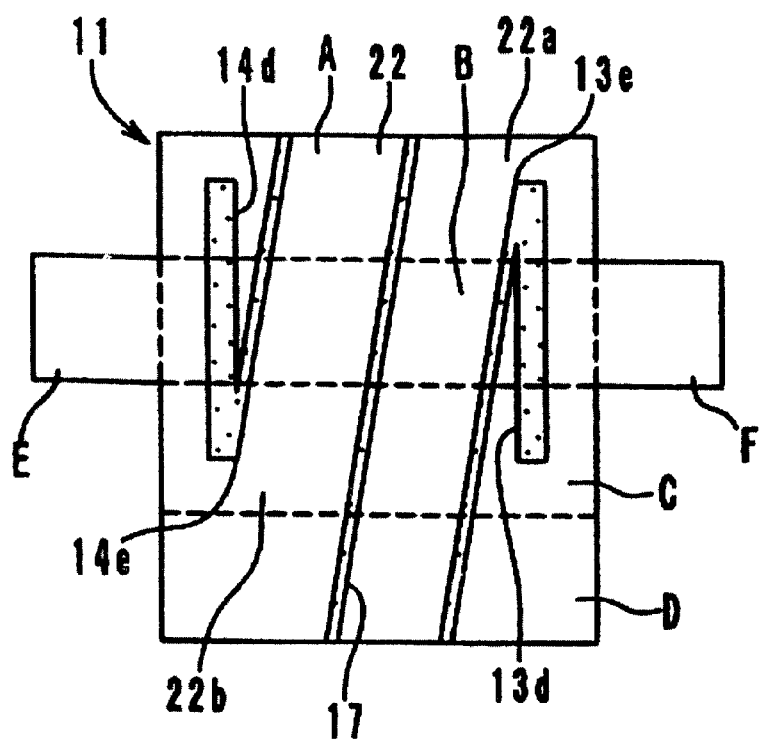
FIG. 42 is a schematic development of a layer on which a first thin-film coil of the multilayer inductor shown in FIG. 40 is provided.

At this time, by adjusting the intensity and the irradiation time of the laser beam so as to increase the processing depth, the insulation layer 27 and the thin-film conductor 12 are removed with the laser beam simultaneously. Thereby, as shown in FIG. 42, the spiral coil-forming groove 17 is provided to have the corner 13e of the winding-dividing groove 13d as a starting end located on the side A of the wound-core member 11 and the corner 14e of the winding-dividing groove 14d as a finishing end located on the side C of the wound-core member 11. Therefore, the thin-film coil 22 spirally winding around the outer periphery of the coil-winding portion 11c is simultaneously formed, such that the thin-film coils 22 and 23 are precisely provided in parallel with each other. Thereby, the distributed capacity between the thin-film coils 22 and 23 is furthermore made uniform. In addition, FIG. 42 is a schematic development of a layer on which the first thin-film coil 22 is provided.

Figure 43:
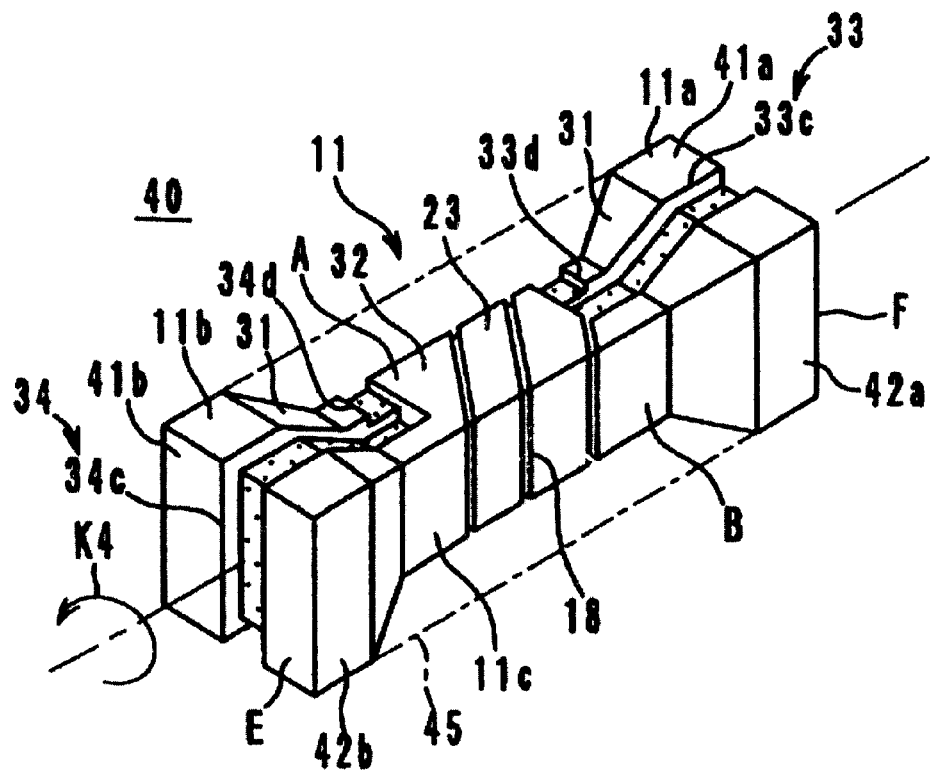
FIG. 43 is a perspective exterior view of the multilayer inductor according to the fourth preferred embodiment.
Figure 44:
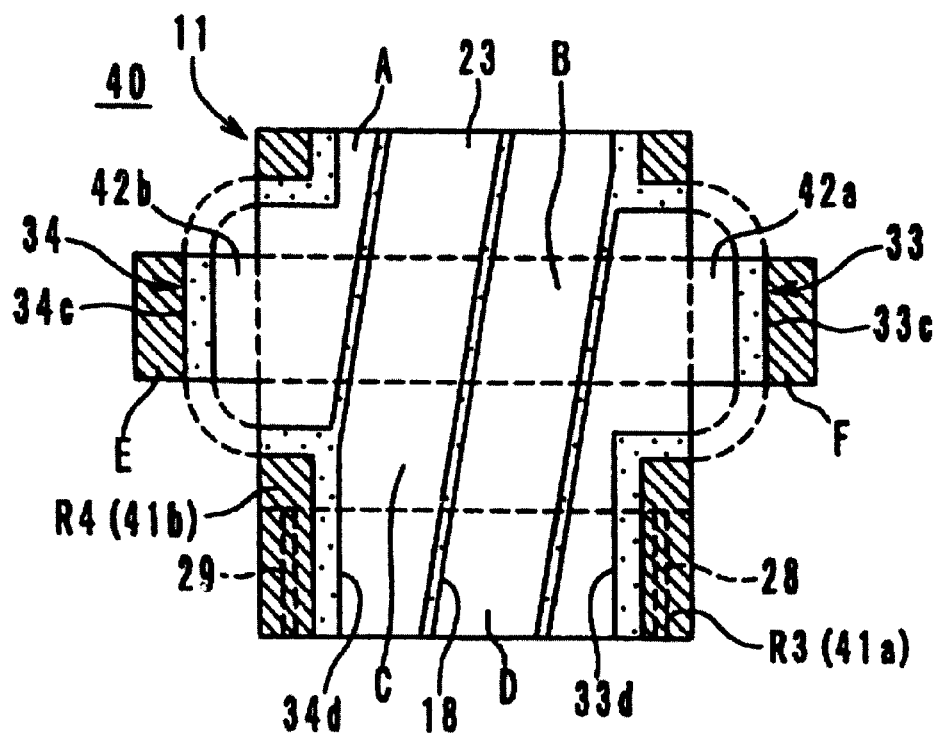
FIG. 44 is a schematic development of the multilayer inductor shown in FIG. 43.
Figure 45:
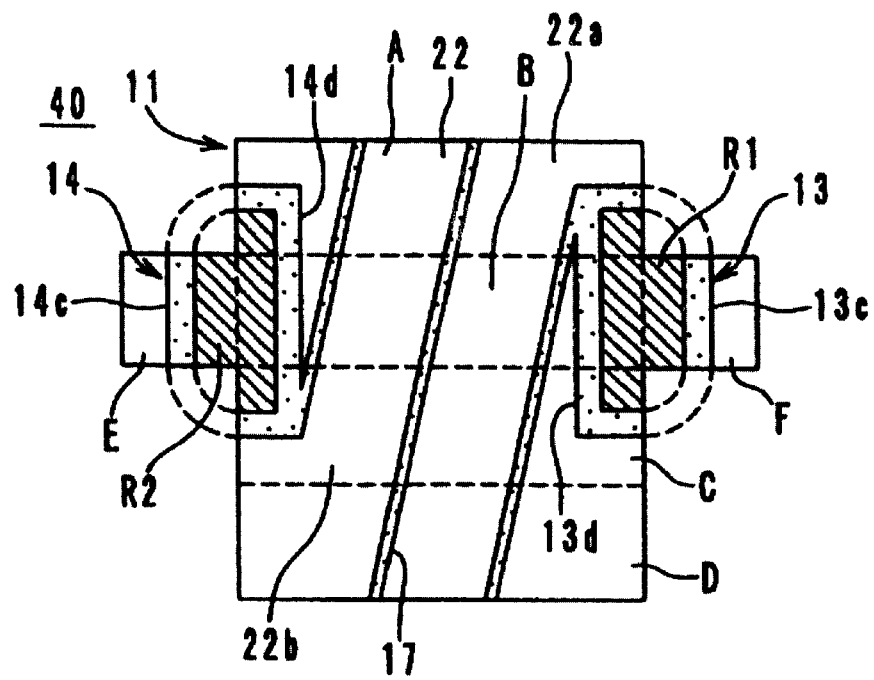
FIG. 45 is a schematic development of a layer on which a first thin-film coil of the multilayer inductor shown in FIG. 43 is provided.

Thereafter, as shown in FIG. 43, a laser beam illuminates the wound-core member 11 according to the following sequence. That is, from one end of the winding-dividing groove 33d as a starting end located on the side A of the wound-core member 11, a laser beam extends through the slope 31 and the flange 11a to extend one end surface F of the wound-core member 11, and furthermore, it winds around the end surface F to extend the other end of the winding-dividing groove 33d as a finishing end via the flange 11a on the side C of the wound-core member 11 and the slope 31 thereon to define the axial dividing groove 33c of the dividing grooves 33 by irradiating the wound-core member 11 with the laser beam. At this time, by adjusting the intensity and the irradiation time of the laser beam to increase the processing depth, the insulation layer 27 and the thin-film conductor 12 are simultaneously removed with the laser beam. Thereby, as shown in FIGS. 44 and 45, the axial dividing groove 13c of the dividing groove 13 is also formed simultaneously with the axial dividing groove 33c of the dividing groove 33. FIG. 44 is a schematic development of the multilayer inductor shown in FIG. 43 and FIG. 45 is a schematic development of a layer on which the first thin-film coil 22 of the multilayer inductor is formed.

Similarly, as shown in FIG. 43, from one end of the winding-dividing groove 34d as a starting end located on the side A of the wound-core member 11, a laser beam is extended through the slope 31 and the flange 11b to reach the other end surface E of the wound-core member 11, and furthermore, it winds around the end surface E to reach the other end of the winding-dividing groove 34d as a finishing end via the flange 11b on the side C of the wound-core member 11 and the slope 31 thereon to form the axial dividing groove 34c of the dividing grooves 34 by irradiating the wound-core member 11 with the laser beam. At this time, the insulation layer 27 and the thin-film conductor 12 are also removed with the laser beam. Thereby, as shown in FIGS. 44 and 45, the axial dividing groove 14c of the dividing groove 14 is also formed simultaneously with the axial dividing groove 34c of the dividing groove 34.

Figure 46:
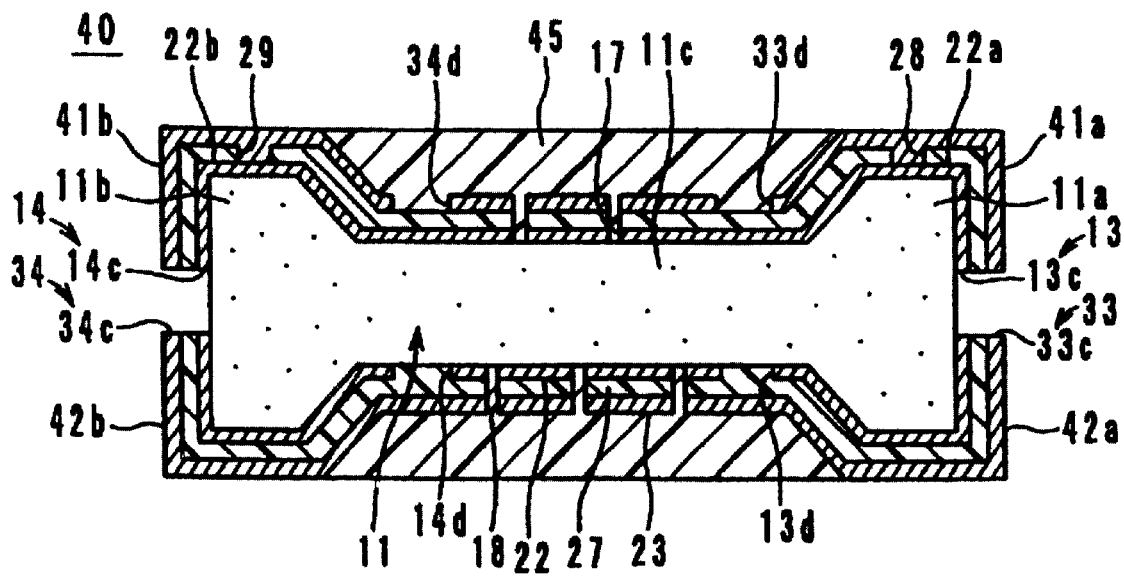
FIG. 46 is a horizontal sectional view of the multilayer inductor shown in FIG. 43.

Thus, the thin-film conductor 32 is divided into the region R3 (diagonally shaded area in FIG. 44) surrounded by the dividing groove 33, the region R4 (diagonally shaded area in FIG. 44) surrounded by the dividing groove 34, and the region of the thin-film coil 23. The regions R3 and R4 and the region of the thin-film coil 23 are electrically insulated with each other. Similarly, the thin-film conductor 12 is divided into the region R1 (diagonally shaded area in FIG. 45) surrounded by the dividing groove 13, the region R2 (diagonally shaded area in FIG. 45) surrounded by the dividing groove 14, and the region of the thin-film coil 22. The regions R1 and R2 and the region of the thin-film coil 22 are electrically insulated with each other. As shown in FIG. 44, the regions R3 and R4 are electrically connected to the starting and finishing ends 22a and 22b of the first thin-film coil 22 via the connection openings 28 and 29, respectively. That is, the regions R3 and R4 define the terminal electrodes 41a and 41b of the first thin-film coil 22 while the starting and finishing ends of the regions in the second thin-film coil 23 define terminal electrodes 42a and 42b of the thin-film coil 23. FIG. 46 is a horizontal sectional view of the multilayer inductor 40 shown in FIG. 43.

In the multilayer inductor 40 produced as described above, the axial dividing grooves 13c and 33c are simultaneously formed while the axial dividing groove 14c and 34c are simultaneously formed, and furthermore, the coil-forming grooves 17 and 18 are simultaneously formed, so that the number of processes is decreased, thereby reducing the manufacturing cost so as to obtain an inexpensive multilayer inductor 40.

The present invention is not limited to the above-described preferred embodiments, and various modifications within the scope of the invention are possible. For example, a substantially columnar or substantially cylindrical wound-core member having a substantially circular, triangular, pentagon, or other cross-section may be used instead of that having the above-described shape. When plural thin-film coils are simply multi-layered, the electrically insulated regions R1 and R2 do not need to be arranged when forming the thin-film coil 22 on the first layer. In this case, however, since an electrostatic capacity generated between the terminal electrodes 42a and 42b on the second layer and the thin-film conductor 12 on the first layer is added, the electrostatic capacity is applied more than is required, such that the noise prevention of the multilayer inductor 40 greatly is reduced.

Figure 47:
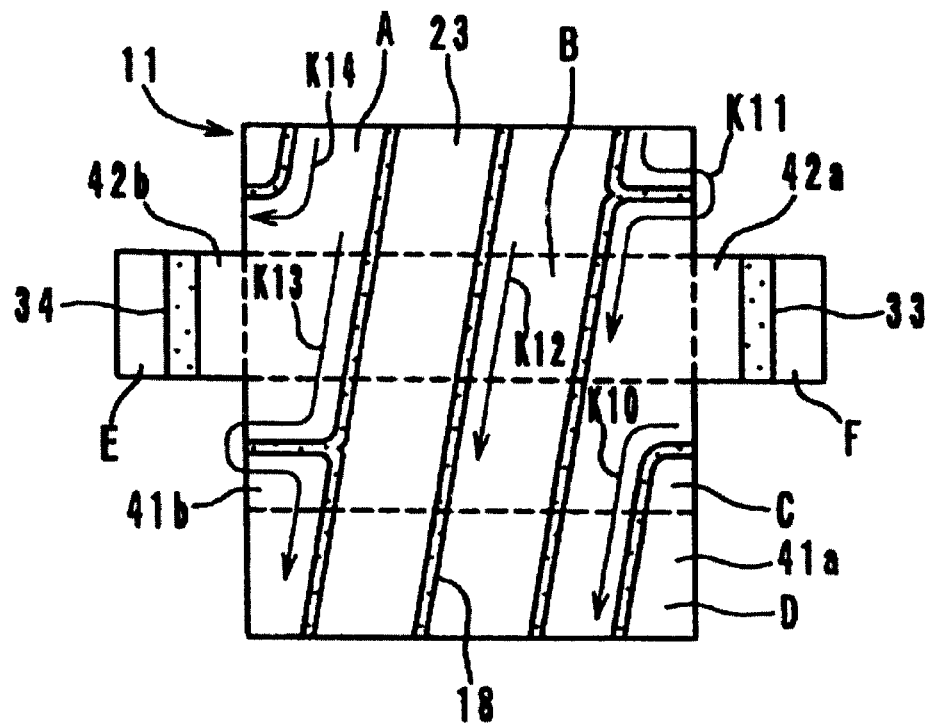
FIG. 47 is a schematic development of a multilayer inductor according to another preferred embodiment of the present invention.
Figure 48:
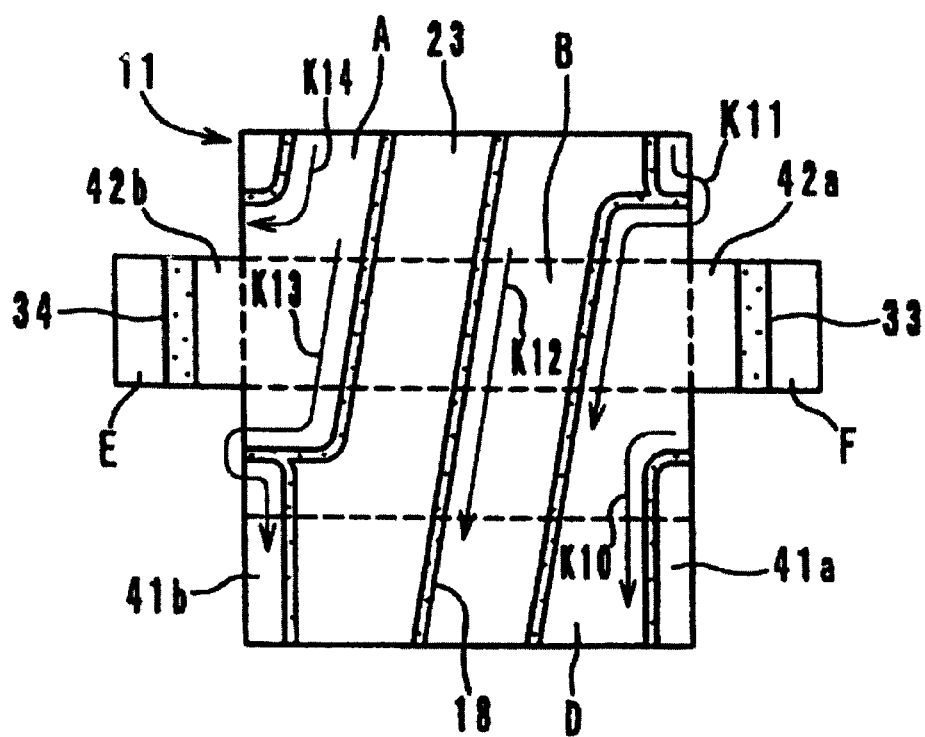
FIG. 48 is a schematic development of a multilayer inductor according to another preferred embodiment of the present invention.

Also, the processing of the dividing groove and the coil-forming groove on the same layer may be performed in the same process by computer controlling. As shown in FIGS. 47 and 48, for example, the coil-forming groove 18 is cut in sequence of the route of arrows K10 to K14; after once proceeding toward the end surfaces F and E of the wound-core member 11, by returning back halfway again, the portions of the dividing grooves 33 and 34 located on the respective sides A and C of the wound-core member 11 can be simultaneously formed. In addition, while the entire portions are slantingly cut corresponding to the pitch of the spiral in FIG. 47, the cut starting portion and the cut finishing portion are respectively cut in parallel with the end faces E and F of the wound-core member 11 in FIG. 48.

Moreover, a dielectric layer may be formed to cover the thin-film coil and a capacitor electrode may be formed on the dielectric layer so as to define an inductor having a capacitor built therein. Furthermore, an electrical element such as a resistor may be built therein; three or more thin-film coils may be deposited by interposing an insulation layer therebetween.

Figure 49A:
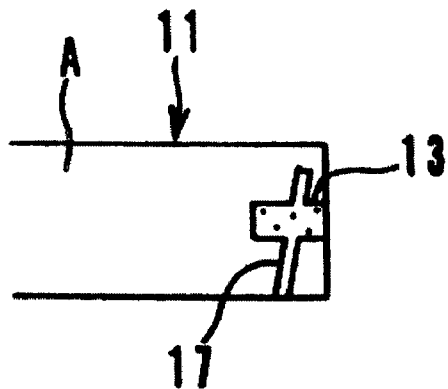
FIGS. 49A and 49B are schematic representations of the connection methods between the coil-forming groove and the dividing groove.
Figure 49B:
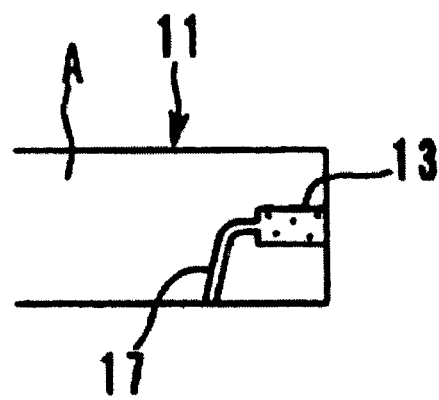

Furthermore, the starting and finishing ends of the coil-forming grooves 17 and 18 do not necessarily agree with ends of the dividing grooves 13, 14, 33, and 34, and the coil-forming grooves may intersect with the dividing grooves as shown in FIG. 49A. The intersection may be substantially T-shaped instead of being cross-shaped as shown in FIG. 49A. As shown in FIG. 49B, the coil-forming groove 17 may also extend so as to connect to the dividing groove 13. The widths of the dividing grooves 13, 14, 33, and 34 are generally larger than those of the coil-forming grooves 17 and 18 so as to improve the insulation reliability. Alternatively, the widths may be substantially the same as those of the coil-forming grooves 17 and 18.

Figure 50:
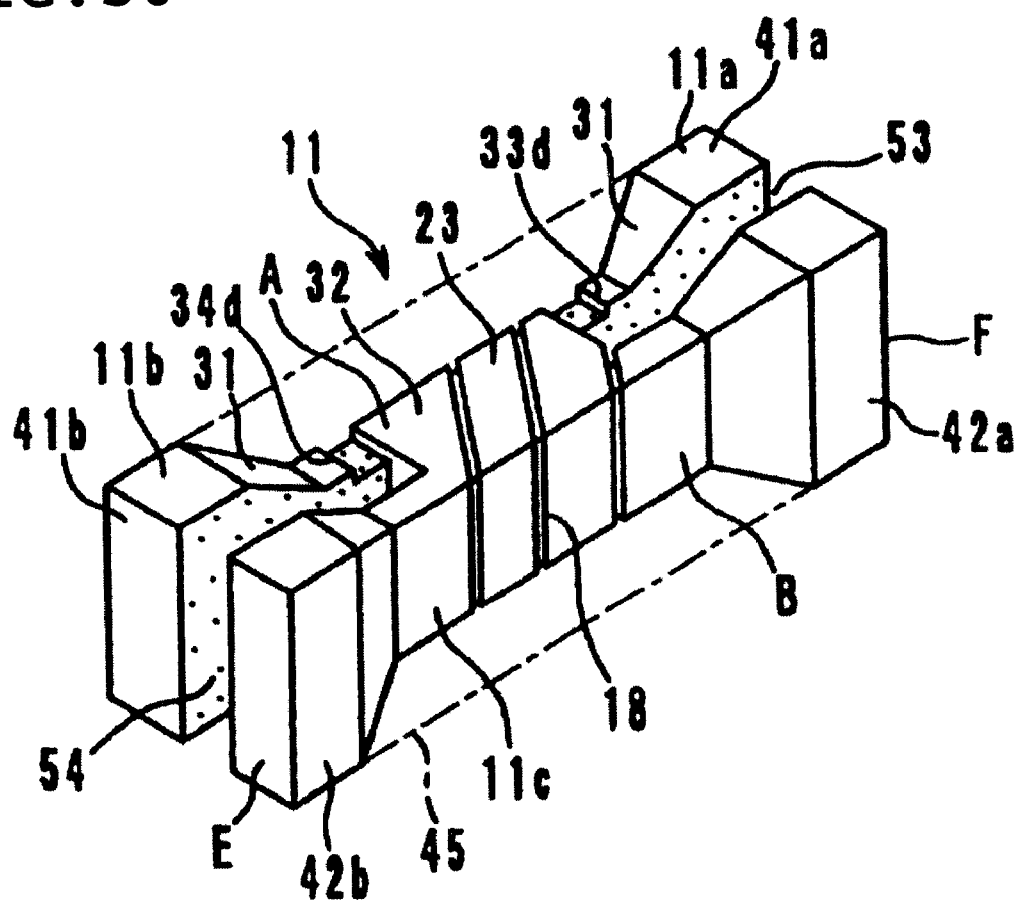
FIG. 50 is a perspective view of a multilayer inductor according to another preferred embodiment of the present invention.
Figure 51:
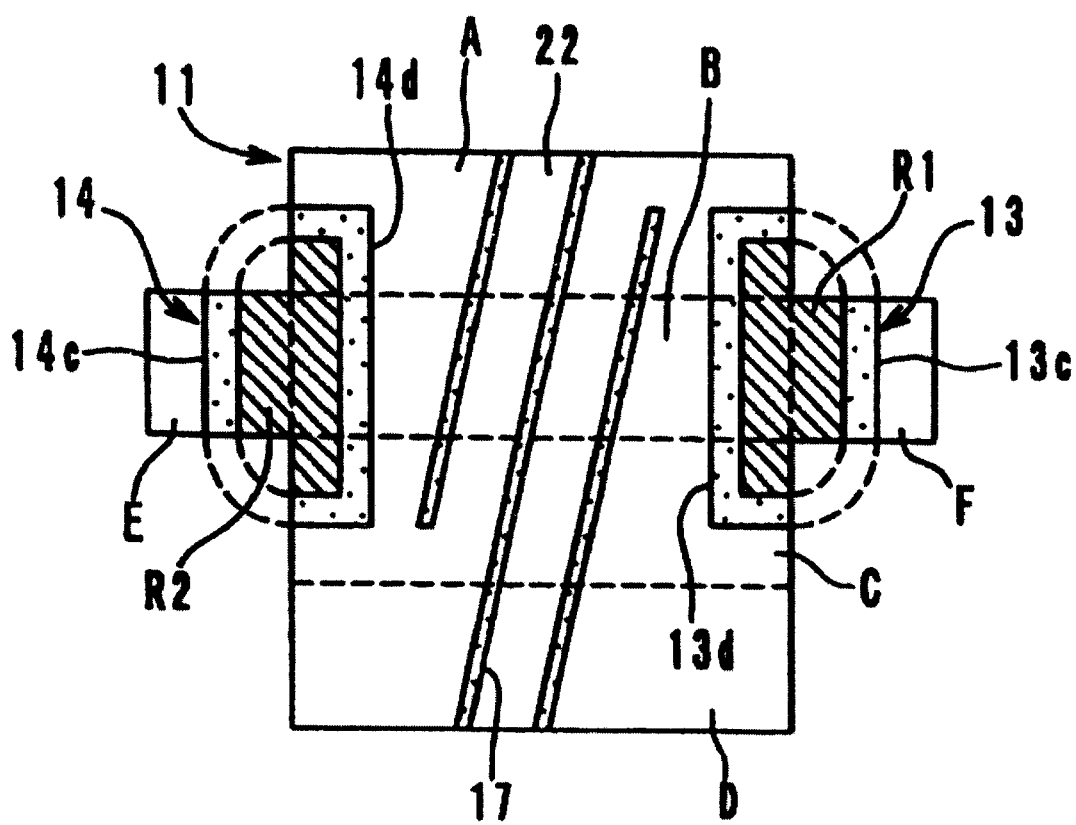
FIG. 51 is a schematic development of a multilayer inductor according to another preferred embodiment of the present invention.

In the second to fourth preferred embodiments described above, the axial dividing grooves 13c, 14c, 33c, and 34c may also be, as shown in FIG. 50, cut grooves 53 and 54 in which both ends of the wound-core member 11 are cut to define slits. The starting and finishing ends of the coil-forming grooves 17 and 18 do not necessarily contact the dividing grooves 13, 14, 33, and 34. For example, as shown in FIG. 51, the starting and finishing ends of the coil-forming groove 17 may be separated from the dividing grooves 13 and 14. This is because that the regions R1 and R2 and the region of the thin-film coil 22 are divided by the dividing grooves 13 and 14, so that both regions are electrically insulated with each other.

When forming the dividing grooves and the coil-forming grooves, a laser beam is utilized in the preferred embodiments; an electron beam or an ion beam may also be used; mechanical cutting such as sandblast or diamond sawing may be used. In the preferred embodiments, a possible method is that after the thin-film conductor is formed on the entire surface of the wound-core member, the unnecessary portions such as the dividing grooves and the coil-forming grooves are removed so as to form the thin-film coils. However, the present invention is not necessarily limited to this method. A so-called additive method in that a conductor is applied to only the necessary portions by a method such as sputtering, vapor deposition, or plating so as to form the thin-film coils may be used.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A multilayer inductor comprising:

a core member;

a plurality of thin-film coils provided on the surface of the core member with an insulation layer interposed therebetween, the thin-film coils being wound in a spiral shape around the outer periphery of the core member; and terminal electrodes arranged at ends of the core member to be electrically connected to each end of respective ones of said plurality of thin-film coils; wherein each of the terminal electrodes is partitioned by a dividing groove on the core member extending from an end surface thereof to the outer periphery thereof such that the terminal electrode is electrically insulated from other terminal electrodes; wherein each of said plurality of thin film coils is formed from and defined by a single layer of thin film.

2. A multilayer inductor according to claim 1, wherein a spiral coil-forming groove is provided on a thin-film conductor which is provided on the outer periphery of the core member, and each of the thin-film coils is defined by the spiral coil-forming groove.

3. A multilayer inductor according to claim 1, wherein a starting end and a finishing end of the spiral coil-forming groove forming each of the thin-film coils are shifted from each other by approximately 180° in the winding direction of the core member.

4. A multilayer inductor according to claim 1, wherein starting ends of spiral coil-forming grooves defining two adjacent thin-film coils having the insulating layer arranged therebetween are shifted from each other by approximately 180° in the winding direction of the core member.

5. A multilayer inductor according to claim 1, wherein the length of the dividing groove between a point where the dividing groove is connected with a spiral coil-forming groove and an end surface of the core member is larger than the lengths of the dividing groove between the starting end of the spiral coil-forming groove and each end surface of the core member and between the finishing end of the spiral coil-forming groove and each end surface of the core member.

6. A multilayer inductor according to claim 1, wherein the dividing groove winds around from the end surface of the core member across the outer periphery thereof.

7. A multilayer inductor according to claim 6, wherein the starting and finishing ends of a spiral coil-forming groove for defining each thin-film coil are located in the same plane as that of the core member.

8. A multilayer inductor according to claim 1, wherein the starting and finishing ends of at least one of the thin-film coils are electrically connected to the respective terminal electrodes via connection openings formed in the insulating layer.

9. A multilayer inductor according to claim 1, wherein the core member is drum-shaped.

10. A multilayer inductor according to claim 1, further comprising a distinguishing portion disposed on at least one of the end surface of the core member and a side thereof for distinguishing the orientation of the core member.

11. A multilayer inductor according to claim 1, wherein the core member includes a coil-winding portion having a substantially square cross-section and flanges provided at both ends of the coil-winding portion.

12. A multilayer inductor according to claim 1, wherein the wound-core member is made from one of a magnetic material, a non-magnetic ceramic material, and a resin material.

13. A multilayer inductor according to claim 1, further comprising an insulation film coated on the surface of the wound-core member and a thin-film conductor disposed on the surface of the wound-core member.

14. A multilayer inductor according to claim 1, wherein the axial dividing grooves are defined by cut grooves in which both ends of the wound-core member are cut to define slits.

15. A multilayer inductor according to claim 1, wherein the starting and finishing ends of the coil-forming grooves contact the dividing grooves.

16. A multilayer inductor according to claim 1, wherein the starting and finishing ends of the coil-forming grooves are separated from the dividing grooves.

17. A multilayer inductor according to claim 1, wherein the core member includes a pair of opposing flanges and two terminal electrodes defining one of the thin-film coils are disposed at respective ones of the opposing flanges.

18. A multilayer inductor according to claim 17, wherein a starting end of the one of the plurality of thin-film coils is electrically connected to one of the two terminal electrodes via a connection opening formed in the core member.

19. A multilayer inductor according to claim 18, wherein a finishing end of the one of the plurality of thin-film coils is electrically connected to the other of the two terminal electrodes via another connection opening formed in the core member.

* * * * *